(12) United States Patent
Nakanishi et al.

(10) Patent No.: US 11,755,076 B2
(45) Date of Patent: Sep. 12, 2023

(54) DISPLAY DEVICE

(71) Applicant: Japan Display Inc., Tokyo (JP)

(72) Inventors: Takayuki Nakanishi, Minato-ku (JP); Naoki Takada, Minato-ku (JP); Yuto Kakinoki, Minato-ku (JP)

(73) Assignee: Japan Display Inc., Tokyo (JP)

( * ) Notice: Subject to any disclaimer, the term of this patent is extended or adjusted under 35 U.S.C. 154(b) by 159 days.

(21) Appl. No.: 17/304,405

(22) Filed: Jun. 21, 2021

(65) Prior Publication Data
US 2021/0311532 A1 Oct. 7, 2021

Related U.S. Application Data

(63) Continuation of application No. PCT/JP2019/034255, filed on Aug. 30, 2019.

(30) Foreign Application Priority Data

Dec. 21, 2018 (JP) .................................. 2018-240092

(51) Int. Cl.
G06F 1/16 (2006.01)
G06F 1/18 (2006.01)

(52) U.S. Cl.
CPC ............ G06F 1/1684 (2013.01); G06F 1/189 (2013.01)

(58) Field of Classification Search
None
See application file for complete search history.

(56) References Cited

U.S. PATENT DOCUMENTS

| 2013/0050126 | A1* | 2/2013 | Kimura | G02F 1/136286 345/173 |
| 2013/0257784 | A1* | 10/2013 | Vandermeijden | G06F 3/0447 345/174 |
| 2017/0031479 | A1* | 2/2017 | Kim | G06F 3/0446 |
| 2017/0220159 | A1* | 8/2017 | Xu | G02F 1/133512 |
| 2018/0031886 | A1* | 2/2018 | Lightfoot | G09G 3/3651 |
| 2020/0201484 | A1* | 6/2020 | Lee | G06F 3/04144 |

FOREIGN PATENT DOCUMENTS

JP 2018-088255 A 6/2018

OTHER PUBLICATIONS

International Search Report dated Oct. 29, 2019 in PCT/JP2019/034255 filed on Aug. 30, 2019, 3 pages (with English Translation).

* cited by examiner

*Primary Examiner* — Matthew Yeung
(74) *Attorney, Agent, or Firm* — Maier & Maier, PLLC

(57) ABSTRACT

Included are at least one first semiconductor resistance element overlapping with one of the spacers and provided as the same layer as the semiconductor layer of the pixel transistors, at least one second semiconductor resistance element provided as the same layer as the semiconductor layer of the pixel transistors and not overlapping with any of the spacers, and a detection circuit detecting a force applied to the display region based on a midpoint voltage between the first semiconductor resistance element and the second semiconductor resistance element, and a resistance value of the second semiconductor resistance element is equivalent to a resistance value of the first semiconductor resistance element when no force is applied.

8 Claims, 27 Drawing Sheets

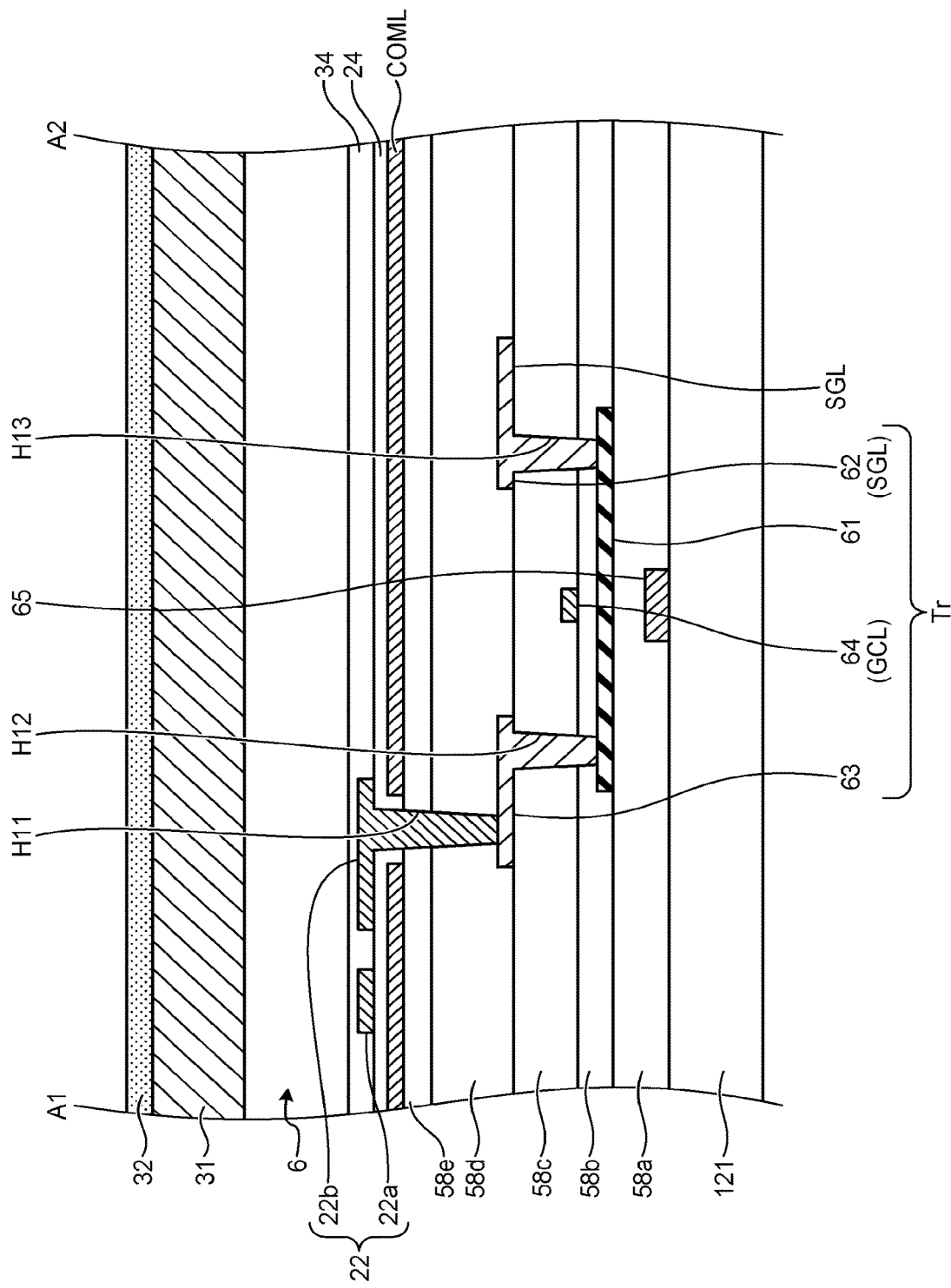

DISPLAY DEVICE

CROSS-REFERENCE TO RELATED APPLICATION

This application is a continuation of International Patent Application No. PCT/JP2019/034255 filed on Aug. 30, 2019 which designates the United States, incorporated herein by reference, and which claims the benefit of priority from Japanese Patent Application No. 2018-240092 filed on Dec. 21, 2018, incorporated herein by reference.

BACKGROUND

1. Technical Field

The present invention relates to a display device.

2. Description of the Related Art

In recent years a touch detection device that can detect an external proximity object, what is called a touch panel, has been gaining attention. The touch panel is mounted on or integrated with a display device such as a liquid crystal display device to be used as a display device. A force detection device that can also detect a force applied to a display face of the display device in addition to touch detection has also started to be used. A configuration is known that detects a force based on a change in capacitance by a change in the distance between an electrode for detection and a reference potential layer, for example (refer to Japanese Patent Application Laid-open Publication No. 2018-88255, for example).

With respect to the above conventional technique, a configuration including a backlight unit between an electrode for detection and a reference potential layer has been disclosed. In such a configuration, when a direct backlight unit or the like is used, for example, the distance between the electrode for detection and the reference potential layer increases and capacitance is reduced, which may cause the detection of a change in capacitance to fail. In a configuration in which a change in capacitance is detected when a force applied to the display face of a display device is detected, an electrode for force detection is required to be provided outside a display panel, which may bring about a cost increase due to an increase in processes.

An object of the present invention is to provide a display device that can provide a configuration for detecting a force applied to a display face at a low cost.

SUMMARY

A display device according to an embodiment of the present disclosure includes a first substrate, a second substrate placed facing the first substrate, and a plurality of spacers provided between the first substrate and the second substrate, the first substrate including a display region in which a plurality of pixels are arrayed in a row direction and a column direction, a plurality of gate lines extending in the row direction and connected to the pixels, a plurality of signal lines extending in the column direction and connected to the pixels, pixel transistors provided in the respective pixels and each having a semiconductor layer, at least one first semiconductor resistance element overlapping with one of the spacers and provided as the same layer as the semiconductor layer of the pixel transistors, at least one second semiconductor resistance element provided as the same layer as the semiconductor layer of the pixel transistors and not overlapping with any of the spacers, and a detection circuit detecting a force applied to the display region based on a midpoint voltage between the first semiconductor resistance element and the second semiconductor resistance element, and a resistance value of the second semiconductor resistance element is equivalent to a resistance value of the first semiconductor resistance element when no force is applied.

BRIEF DESCRIPTION OF THE DRAWINGS

FIG. 4 is a sectional view along the A1-A2 line in FIG. 3;

DETAILED DESCRIPTION

The following describes aspects (embodiments) to perform the present invention in detail with reference to the accompanying drawings. The details described in the following embodiments do not limit the present invention. The components described in the following include components that can easily be thought of by those skilled in the art and substantially the same components. Furthermore, the components described in the following can be combined with each other as appropriate. What is disclosed herein is merely by way of example, and some appropriate modifications with the gist of the invention maintained that can easily be thought of by those skilled in the art are naturally included in the scope of the present invention. The drawings may be represented more schematically for the width, thickness, shape, and the like of parts than those of actual aspects in order to make the description clearer; however, they are only by way of example and do not limit the interpretation of the present invention. In the present specification and drawings, components similar to those previously described for the drawings previously described are denoted by the same symbols, and a detailed description may be omitted as appropriate.

First Embodiment

Figure 1:
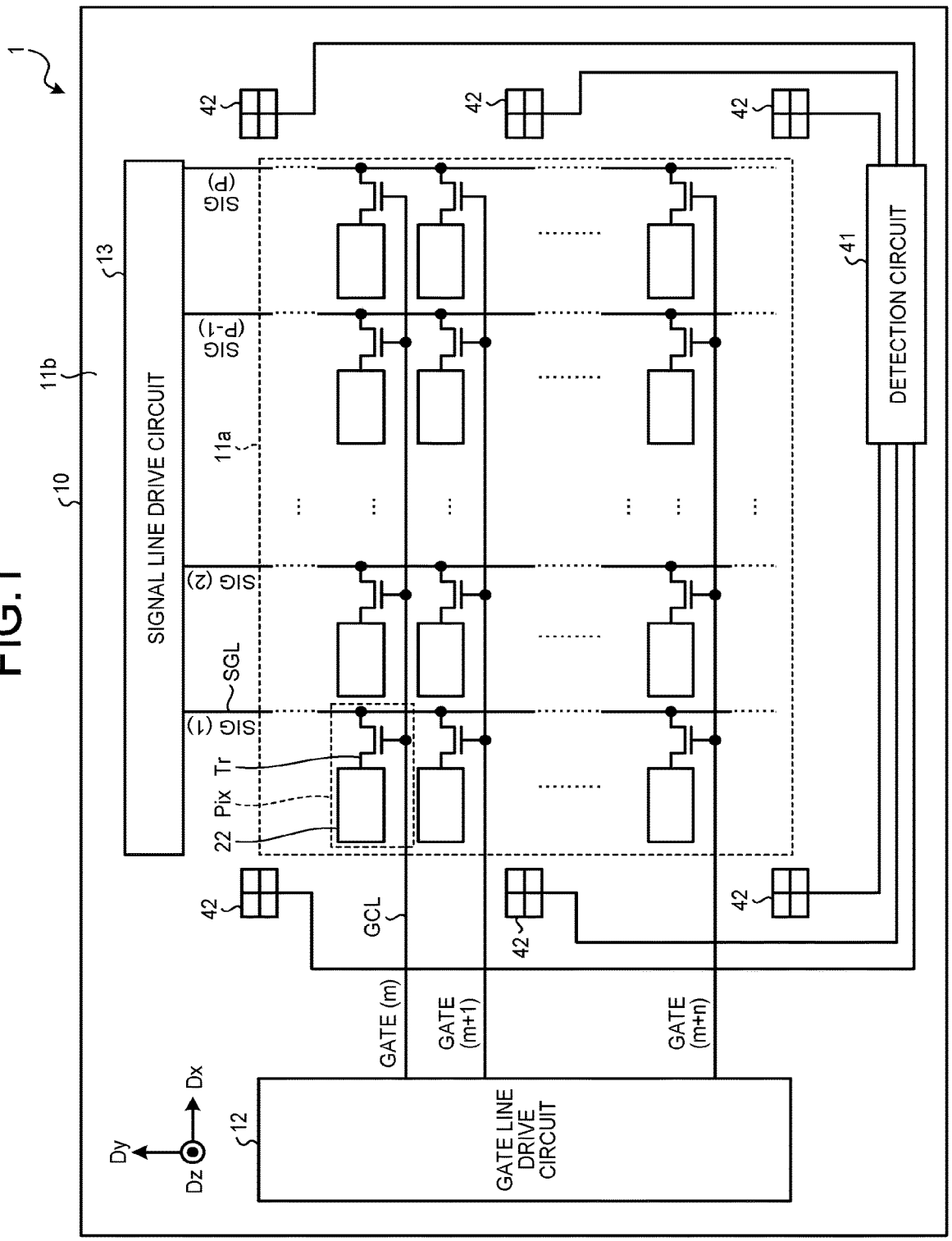
FIG. 1 is a block diagram of a configuration example of a display device according to a first embodiment.

FIG. 1 is a block diagram of a configuration example of a display device according to a first embodiment. As illustrated in FIG. 1, this display device 1 includes a display region 11a for displaying an image, a gate line drive circuit 12, a signal line drive circuit 13, and a detection circuit 41 on a display panel 10.

A capacitive touch sensor may be mounted on or integrated with the display panel 10. Integrating the capacitive touch sensor with the display panel 10 includes using partial members such as a substrate and an electrode of the display region 11a also as partial members such as a substrate and an electrode used as the touch sensor, for example.

A plurality of pixels Pix arrayed in a row direction (a Dx direction) and a column direction (a Dy direction) are provided in the display region 11a. Although FIG. 1 illustrates partial pixels Pix, the pixels Pix are placed across the entire area of the display region 11a. Although the present embodiment exemplifies a configuration in which a liquid crystal display element is used as a display element, the aspect of the display element does not limit the present disclosure.

The pixels Pix each include a pixel electrode 22 and a pixel transistor Tr. The pixel transistor Tr includes a thin film transistor (TFT), and includes a TFT of an re-channel metal oxide semiconductor (MOS) type, for example. A source of the pixel transistor Tr is connected to a signal line SGL, a gate thereof is connected to a gate line GCL, and a drain thereof is connected to the pixel electrode 22.

A pixel Pix and another pixel Pix are connected to each other with the gate line GCL extending in the row direction (the Dx direction). Gate lines GCL are connected to the gate line drive circuit 12, and gate signals GATE ( . . . , m, m+1, . . . , m+n, . . . ) are supplied from the gate line drive circuit 12.

A pixel Pix and another pixel Pix are connected to each other with the signal line SGL extending in the column direction (the Dy direction). Signal lines SGL are connected to the signal line drive circuit 13, and pixel signals SIG (1, 2, . . . , P) are supplied from the signal line drive circuit 13.

The gate line drive circuit 12 is a circuit supplying the gate signals GATE ( . . . , m, m+1, . . . , m+n, . . . ) to the gates of the pixel transistors Tr of the pixels Pix on Rows 1, 2, . . . , P via the respective gate lines GCL.

The signal line drive circuit 13 is a circuit supplying pixel signals SIG (1, 2, . . . , Q) to the sources of the pixel transistors Tr of the pixels Pix via the respective signal lines SGL. The signal line drive circuit 13 simultaneously supplies the pixel signals SIG (1, 2, . . . , Q) to the pixels Pix on Rows 1, 2, . . . , P.

The display device 1 is provided with sensor parts 42 in a frame region 11b outside the display region 11a. Although FIG. 1 exemplifies a configuration in which three sensor parts 42 are provided on each of both sides extending in the column direction (the Dy direction) of the display region 11a, the sensor parts 42 may be provided outside the four corners of the display region 11a. The sensor parts 42 may be provided along the outside of the sides of the display region 11a. The sensor parts 42 may be provided inside the display region 11a. The number and the arrangement of the sensor parts 42 do not limit the present disclosure.

The detection circuit 41 and the sensor parts 42 form a force detector 40 detecting a force applied to the display region 11a (a display face). The force detector 40 will be described below.

The display region 11a is provided with a drive electrode COML. The drive electrode COML overlaps with the display region 11a in a direction (a Dz direction) orthogonal to the row direction (the Dx direction) and the column direction (the Dy direction).

When image display is performed on the display region 11a, a common potential Vcomdc for the pixel electrode 22 is supplied to the drive electrode COML. Thus, the drive electrode COML functions as a common electrode for the pixel electrode 22 when image display is performed on the display region 11a. The drive electrode COML, by being supplied with a drive signal for detection, functions also as a sensor electrode when performing touch detection; a detailed description is omitted here.

The gate line drive circuit 12, the signal line drive circuit 13, and the detection circuit 41 may each be an individual device (integrated circuit (IC)) or may be one or a plurality of devices (ICs) in which the functions described above are integrated. The configurations of the gate line drive circuit 12, the signal line drive circuit 13, and the detection circuit 41 do not limit the present disclosure.

Figure 2:
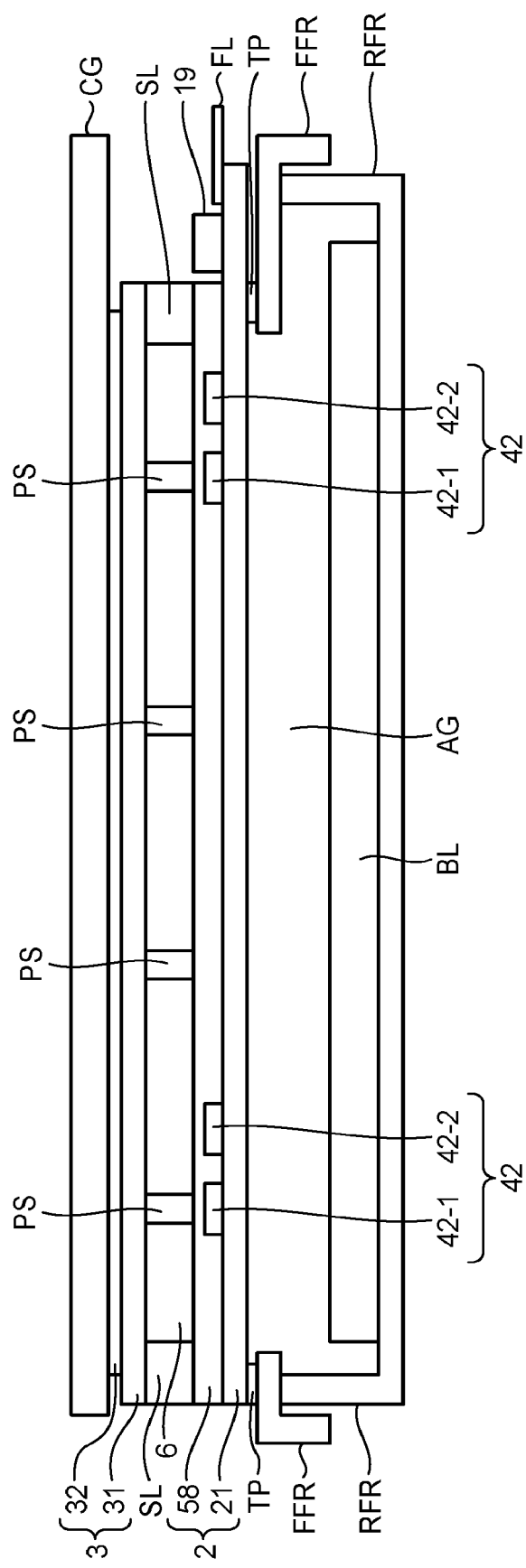
FIG. 2 is a sectional view of a schematic sectional structure of the display device.
Figure 3:
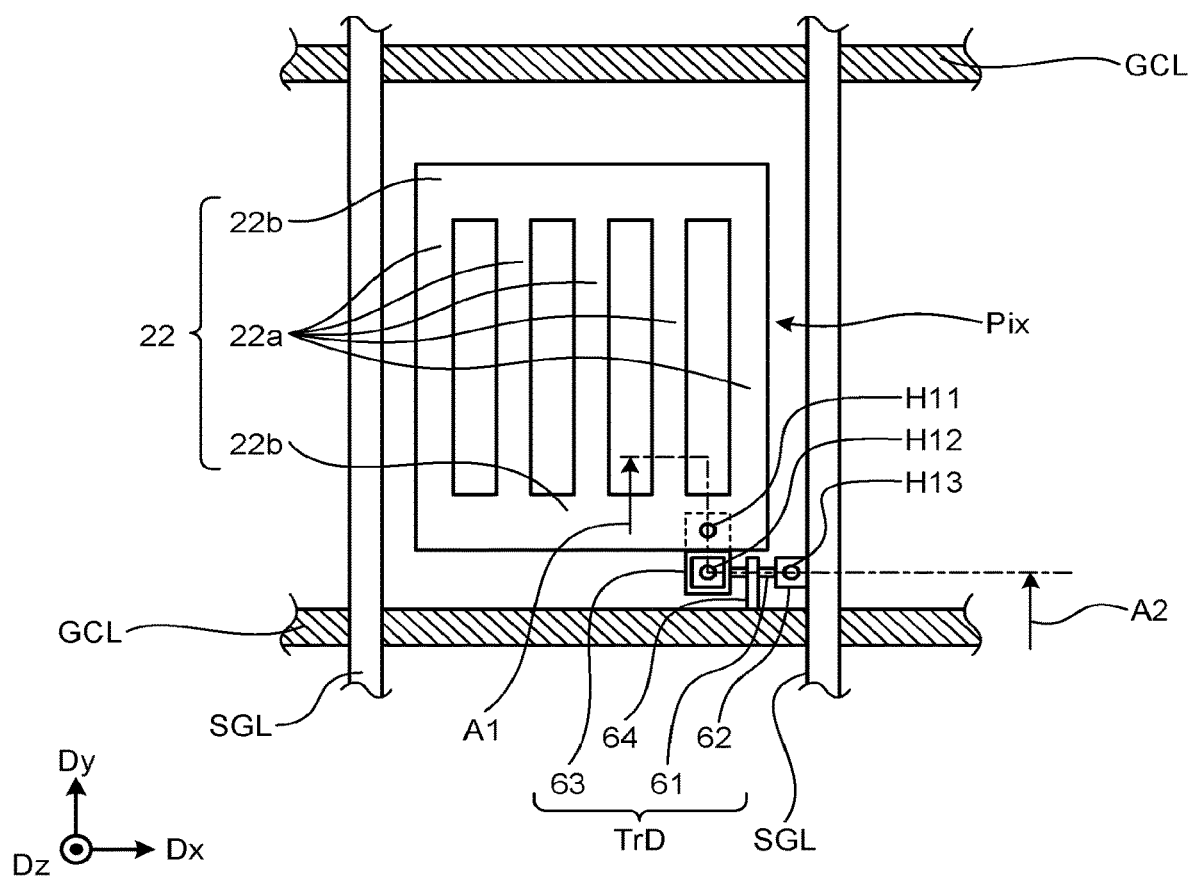
FIG. 3 is a plan view of a configuration example of a pixel.
Figure 5A:
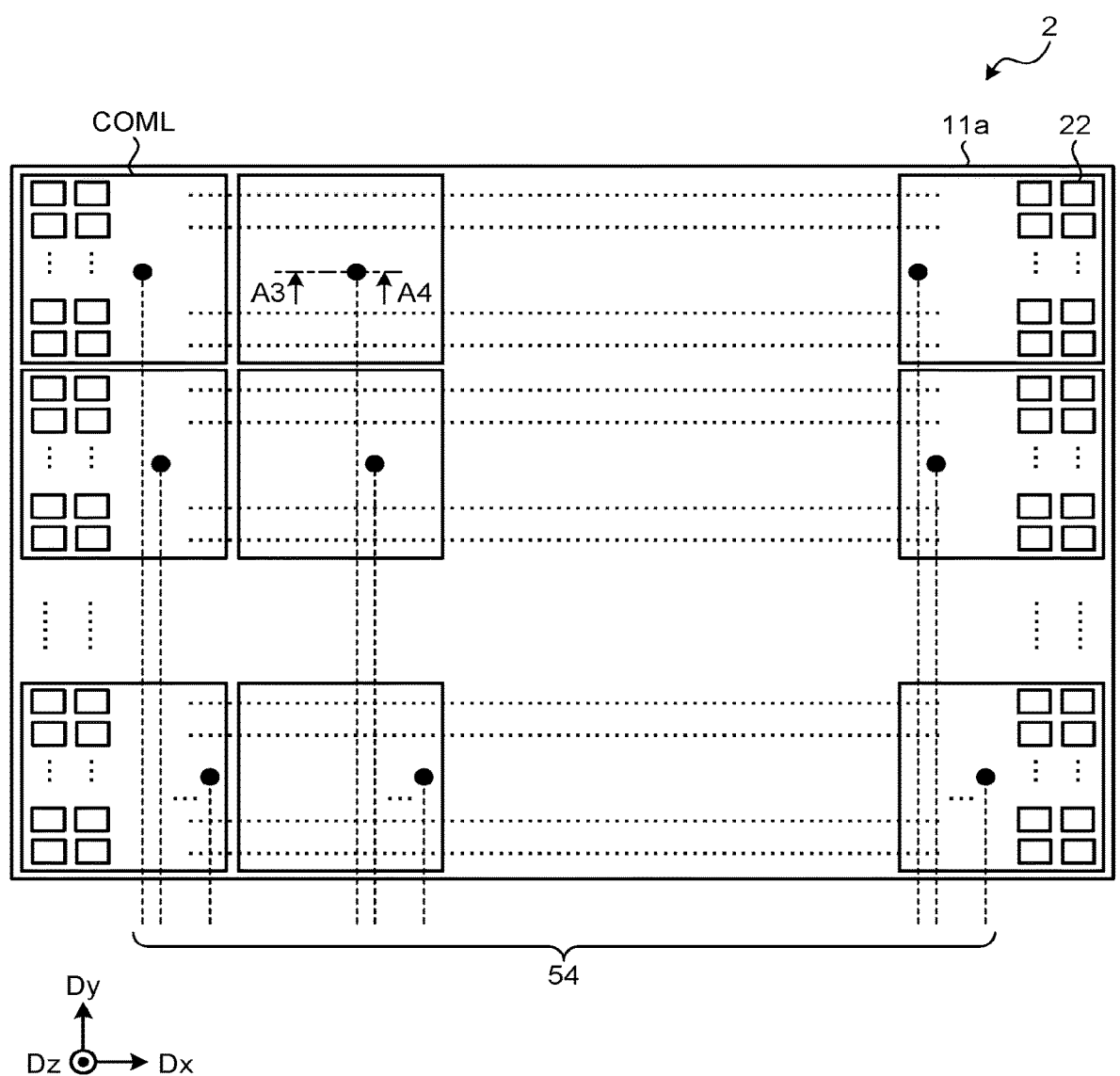
FIG. 5A is a plan view of a first example schematically illustrating a first substrate forming the display device according to the first embodiment.
Figure 5B:
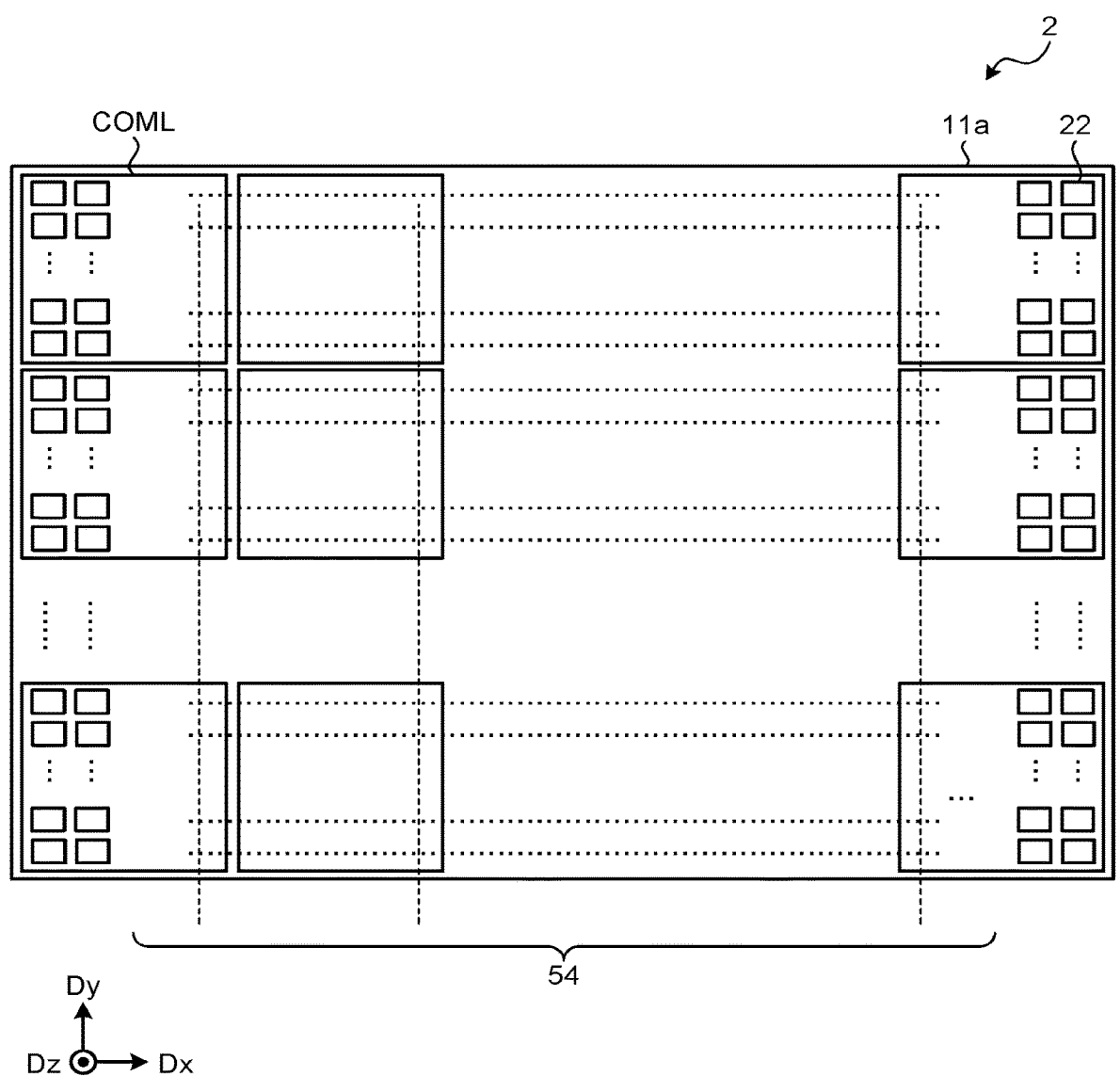
FIG. 5B is a plan view of a second example schematically illustrating the first substrate forming the display device according to the first embodiment.
Figure 5C:
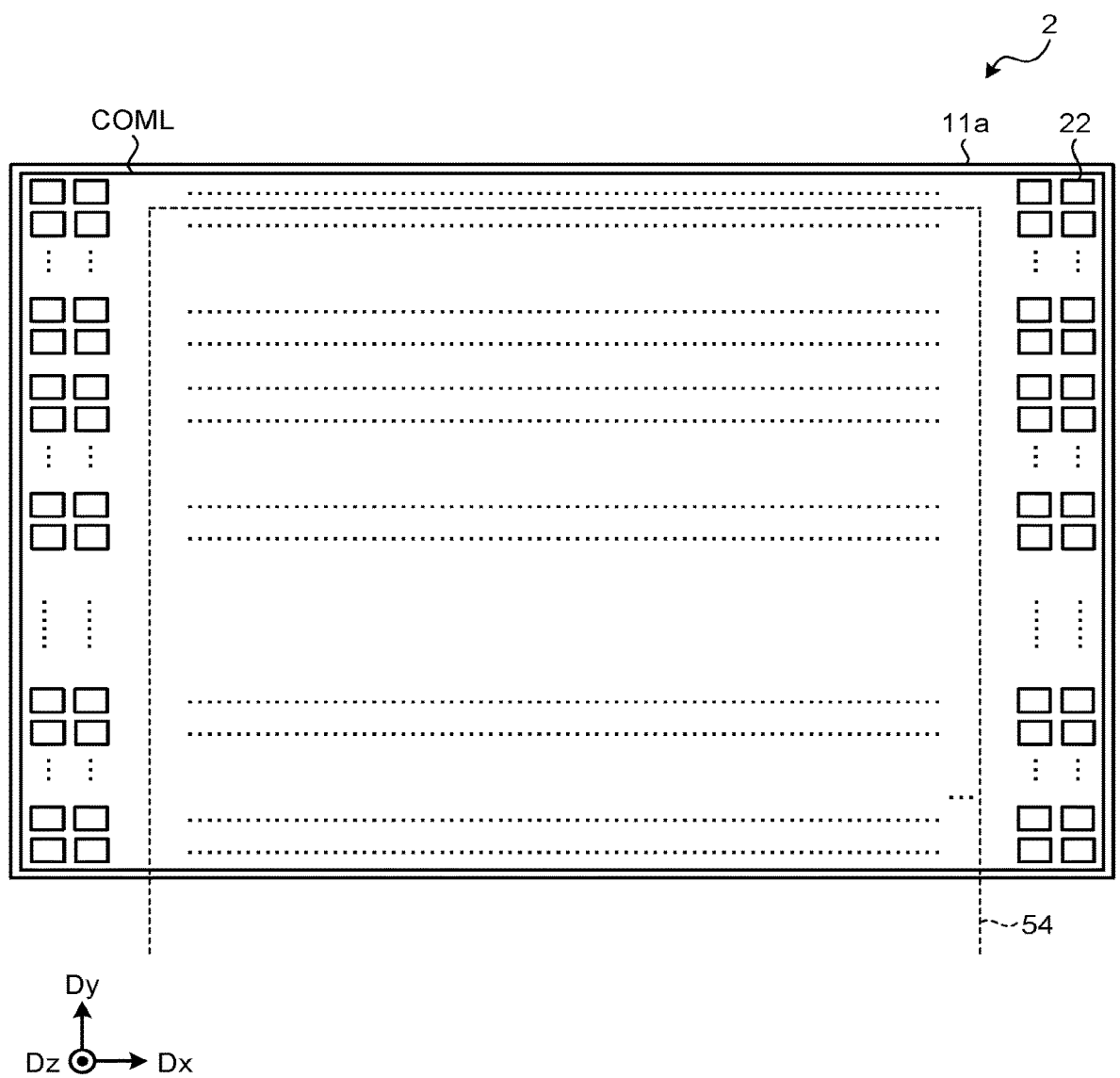
FIG. 5C is a plan view of a third example schematically illustrating the first substrate forming the display device according to the first embodiment.
Figure 5D:
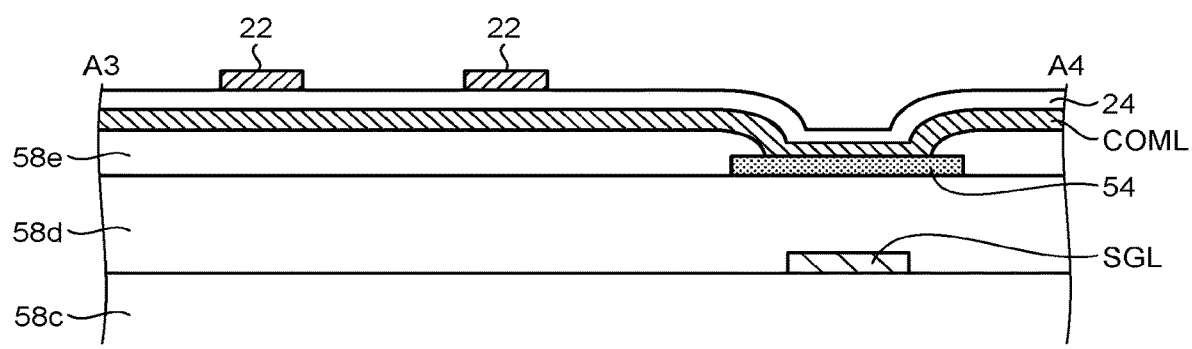
FIG. 5D is a sectional view along the A3-A4 line in FIG. 5A.

The following describes a schematic structure of the display device 1 according to the first embodiment with reference to FIG. 2 to FIG. 5D. FIG. 2 is a sectional view of a schematic sectional structure of the display device. FIG. 3 is a plan view of a configuration example of a pixel. FIG. 4 is a sectional view along the A1-A2 line in FIG. 3. FIG. 5A is a plan view of a first example schematically illustrating a first substrate forming the display device according to the first embodiment. FIG. 5B is a plan view of a second example schematically illustrating the first substrate forming the display device according to the first embodiment. FIG. 5C is a plan view of a third example schematically illustrating the first substrate forming the display device according to the first embodiment. FIG. 5D is a sectional view along the A3-A4 line in FIG. 5A.

As illustrated in FIG. 2, the display device 1 includes a cover member CG, a first substrate 2, a second substrate 3, a liquid crystal layer 6, a COG 19, a flexible printed board FL, a backlight BL, and frames FFR and RFR.

The COG 19 is an IC including the gate line drive circuit 12, the signal line drive circuit 13, and the detection circuit 41, for example. The COG 19 is mounted on the first substrate 2. The flexible printed board FL is connected to the first substrate 2. The flexible printed board FL is connected to a host (not illustrated).

The first substrate 2 has a TFT substrate 21. The TFT substrate 21 is provided with switching elements such as the pixel transistors Tr, various kinds of wires such as the gate lines GCL and the signal lines SGL, and various kinds of electrodes (omitted in FIG. 2) such as pixel electrodes 22 and the drive electrodes COML other than the COG 19. The sensor parts 42 according to the present embodiment are provided on this TFT substrate 21.

The second substrate 3 includes a CF substrate 31 and a color filter (not illustrated) formed on one face of this CF substrate 31. A polarizing plate 32 is provided above the color filter via an adhesive layer (not illustrated).

The first substrate 2 and the second substrate 3 are placed facing each other with a certain spacing (a cell gap) provided therebetween. The liquid crystal layer 6 is provided as a display function layer in a space between the TFT substrate 21 and the CF substrate 31. The liquid crystal layer 6 modulates light passing therethrough in accordance with an electric field state; liquid crystals of the transverse electric mode such as in-plane switching (IPS) including fringe field switching (FFS) are used therefor, for example. An orientation film may be provided between the liquid crystal layer 6 and the first substrate 2 and between the liquid crystal layer 6 and the second substrate 3.

The liquid crystal layer 6 is provided with spacers PS formed of a glass material or a resin material in order to the maintain the spacing (cell gap) between the first substrate 2 and the second substrate 3 uniform. In the present embodiment, the spacers PS are provided not only in the display region 11a but also in the frame region 11b outside the display region 11a.

In the present embodiment, in a direction perpendicular to a surface of the TFT substrate 21, a direction toward the second substrate 3 from the first substrate 2 is defined as "above". A direction toward the second substrate 3 from the first substrate 2 is defined as "below". A "plan view" indicates a case when viewed in a direction perpendicular to a surface of the first substrate 2.

In the present embodiment, as illustrated in FIG. 2, each sensor part 42 includes a first sensor 42-1 provided overlapping with a spacer PS via an insulating layer 58 and a second sensor 42-2 not overlapping with the spacer PS. The first sensor 42-1 and the second sensor 42-2 will be described below.

As illustrated in FIG. 3, a region surrounded by the gate lines GCL and the gate lines SGL is the pixel Pix. The pixel Pix is provided including a region in which the pixel electrode 22 and the drive electrode COML overlap with each other. The pixel electrode 22 is connected to the gate line SGL via the pixel transistor Tr.

As illustrated in FIG. 3, the pixel electrode 22 has a plurality of band-like electrodes 22a and coupling parts 22b. The band-like electrodes 22a are provided along the gate lines SGL and are arrayed in a direction along the gate lines GCL. The coupling parts 22b couple ends of the band-like electrodes 22a to each other. Although the pixel electrode 22 has five band-like electrodes 22a, this is not limiting; the pixel electrode 22 may have four or less, or six or more band-like electrodes 22a. The pixel electrode 22 may have two band-like electrodes 22a, for example.

As illustrated in FIG. 3, the pixel transistor Tr includes a semiconductor layer 61, a source electrode 62, a drain electrode 63, and a gate electrode 64. A light shielding layer 65 is provided below the semiconductor layer 61.

As illustrated in FIG. 4, the light shielding layer 65 is provided on a substrate 121. An insulating layer 58a, covering the light shielding layer 65, is provided on the substrate 121. The semiconductor layer 61 is provided on the insulating layer 58a. The gate electrode 64 (the gate line GCL) is provided above the semiconductor layer 61 via an insulating layer 58b. The drain electrode 63 and the source electrode 62 (the signal line SGL) are provided above the gate electrode 64 (the gate line GCL) via an insulating layer 58c. The drive electrode COML is provided above the drain electrode 63 and the source electrode 62 (the signal line SGL) via an insulating layer 58d and an insulating layer 58e. The pixel electrode 22 is provided above the drive electrode COML via an insulating layer 24. An orientation film 34 is provided on the pixel electrode 22. An orientation film 33 faces the orientation film 34 across the liquid crystal layer 6. An auxiliary wire 54 for supplying the common potential Vcomdc or the drive signal for detection to the drive electrode COML is provided on the insulating layer 58d.

As illustrated in FIG. 5A to FIG. 5C, the drive electrode COML is provided in the display region 11a of the TFT substrate 21. In the first example illustrated in FIG. 5A, a plurality of the drive electrodes COML are provided within the display region 11a. More specifically, the drive electrodes COML are arrayed in a direction along a long side of the display region 11a (the Dx direction) and a direction along a short side of the display region 20 (the Dy direction). Each of the drive electrodes COML is substantially square in a plan view. The drive electrodes COML are formed of a conductive material having translucency such as indium tin oxide (ITO), for example. The pixel electrodes 22 are arranged in a place corresponding to one drive electrode COML in a matrix with a row-column configuration. The pixel electrodes 22 have an area smaller than that of the drive electrode COML. Although FIG. 5A to FIG. 5C illustrate partial drive electrodes COML and pixel electrodes 22, the drive electrodes COML and the pixel electrodes 22 are placed across the entire area of the display region 11a.

As illustrated in FIG. 5D, the drive electrode COML is electrically connected to the auxiliary wire 54, and the common potential Vcomdc or the drive signal for detection is supplied to the drive electrode COML. In FIG. 5D, illustration of the layers below the insulating layer 58 illustrated in FIG. 4 is omitted.

As to the drive electrodes COML, as in the second example illustrated in FIG. 5B, the drive electrodes COML extending in the direction along the short side of the display region 20 (the Dy direction) may be arrayed in the direction along the long side of the display region 11a (the Dx direction), or as in the third example illustrated in FIG. 5C, one drive electrode COML may be provided across the entire area of the display region 11a.

As illustrated in FIG. 3 and FIG. 4, the pixel electrode 22 is connected to the drain electrode 63 of the pixel transistor Tr via a contact hole H11. The semiconductor layer 61 is connected to the drain electrode 63 via a contact hole H12. The semiconductor layer 61 crosses the gate electrode 64 in a plan view. The gate electrode 64 is connected to the gate line GCL and is provided protruding from one side of the gate line GCL. The semiconductor layer 61 extends to a position overlapping with the source electrode 62, and is electrically connected to the source electrode 62 via a contact hole H13. The source electrode 62 is connected to the signal line SGL and protrudes from one side of the signal line SGL.

For the material of the semiconductor layer 61, a known material such as polysilicon or an oxide semiconductor can be used. A transparent amorphous oxide semiconductor (TAOS) is used, for example, whereby the ability to hold voltage for image display for a long time (a holding rate) is good, and display quality can be improved.

For the materials of the insulating layers 24, 58a, 58b, 58c, 58d, and 58e, known insulating materials can be used. For the material of the insulating layer 58b, for example, tetraethyl orthosilicate (TEOS) can be used. For the material of the insulating layer 58c, for example, silicon oxide film ($SiO_2$) can be used.

The material of the auxiliary wire 54 is desirably formed of a conductive metallic material. For the conductive metallic material, aluminum (Al), molybdenum (Mo), or the like can be used, for example.

As illustrated in FIG. 2, the backlight BL is provided on the back of the first substrate 2. The backlight BL is housed in the frames FFR and RFR and faces the first substrate 2 via an air layer (air gap) AG. The first substrate 2 is fixed to the frame FFR with adhesive tape TP.

In the semiconductor layer 61, a channel part (not illustrated) is provided at a part overlapping with the gate electrode 64. The light shielding layer 65 is provided in a place overlapping with the channel part and preferably has an area larger than that of the channel part. The light shielding layer 65 is provided, whereby light entering the semiconductor layer 61 from the backlight BL is blocked.

Figure 6:
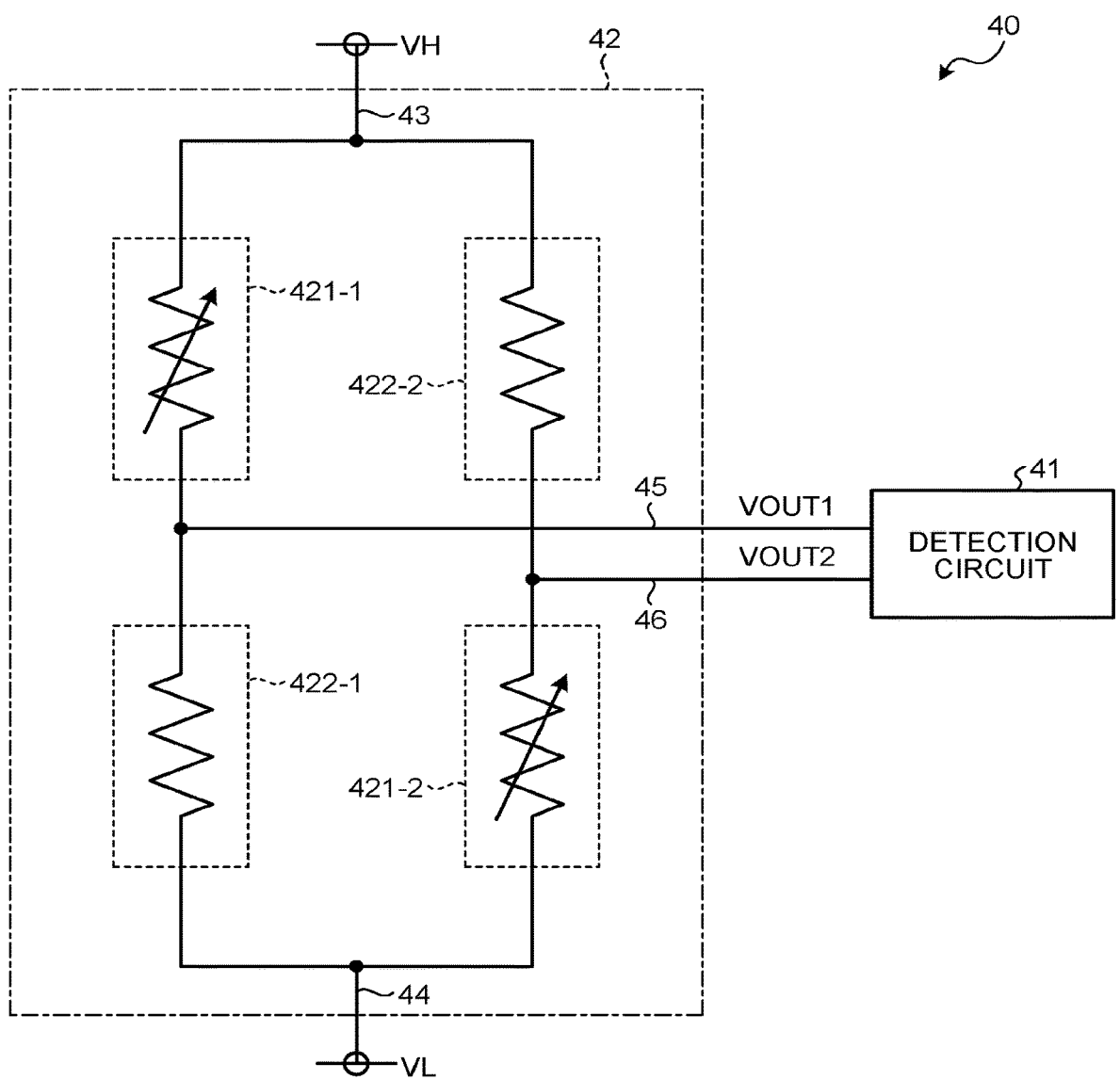
FIG. 6 is an equivalent circuit diagram of a configuration example of a force detector according to the first embodiment.
Figure 7:
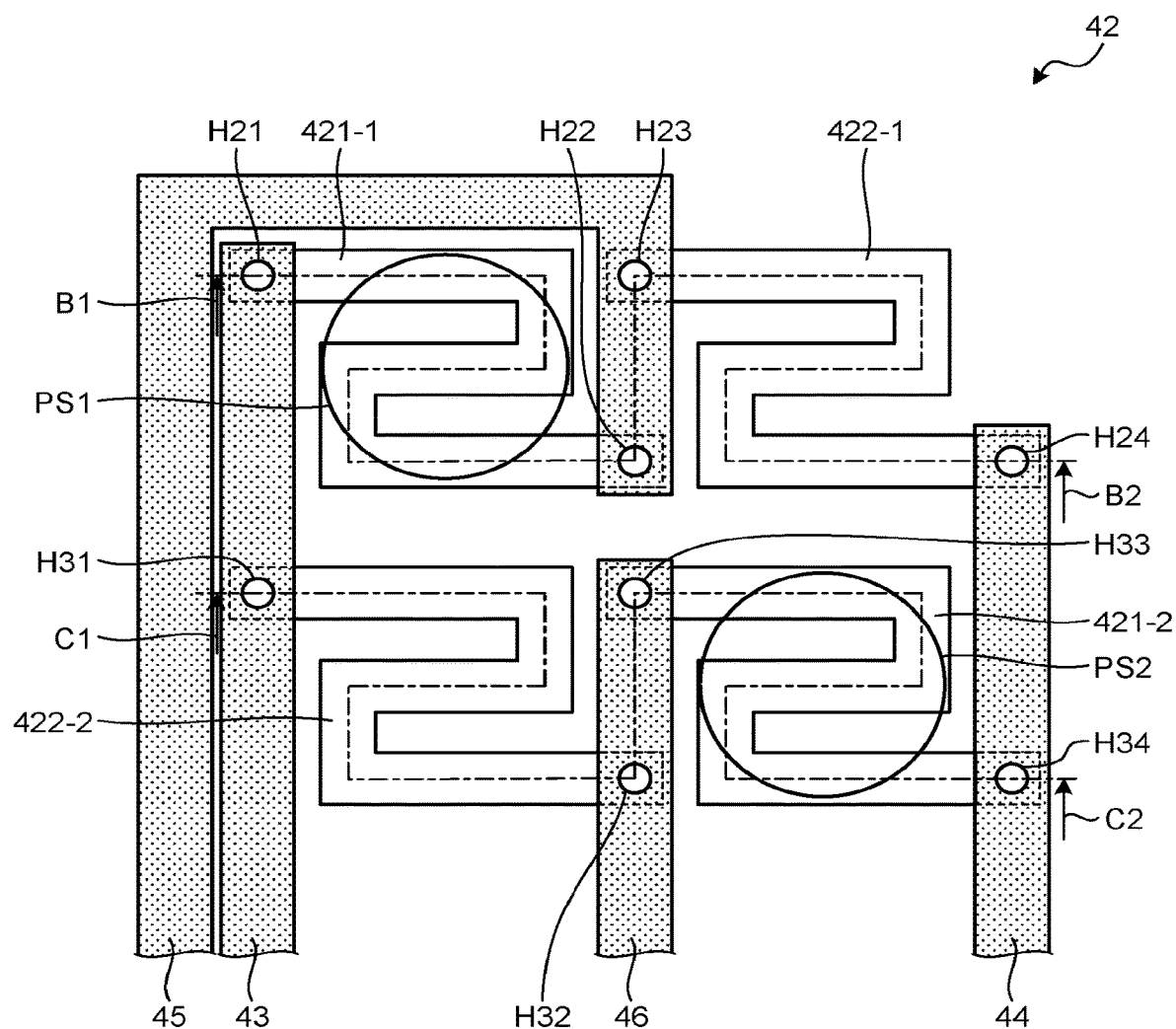
FIG. 7 is a plan view of a first configuration example of a sensor part according to the first embodiment.
Figure 8:
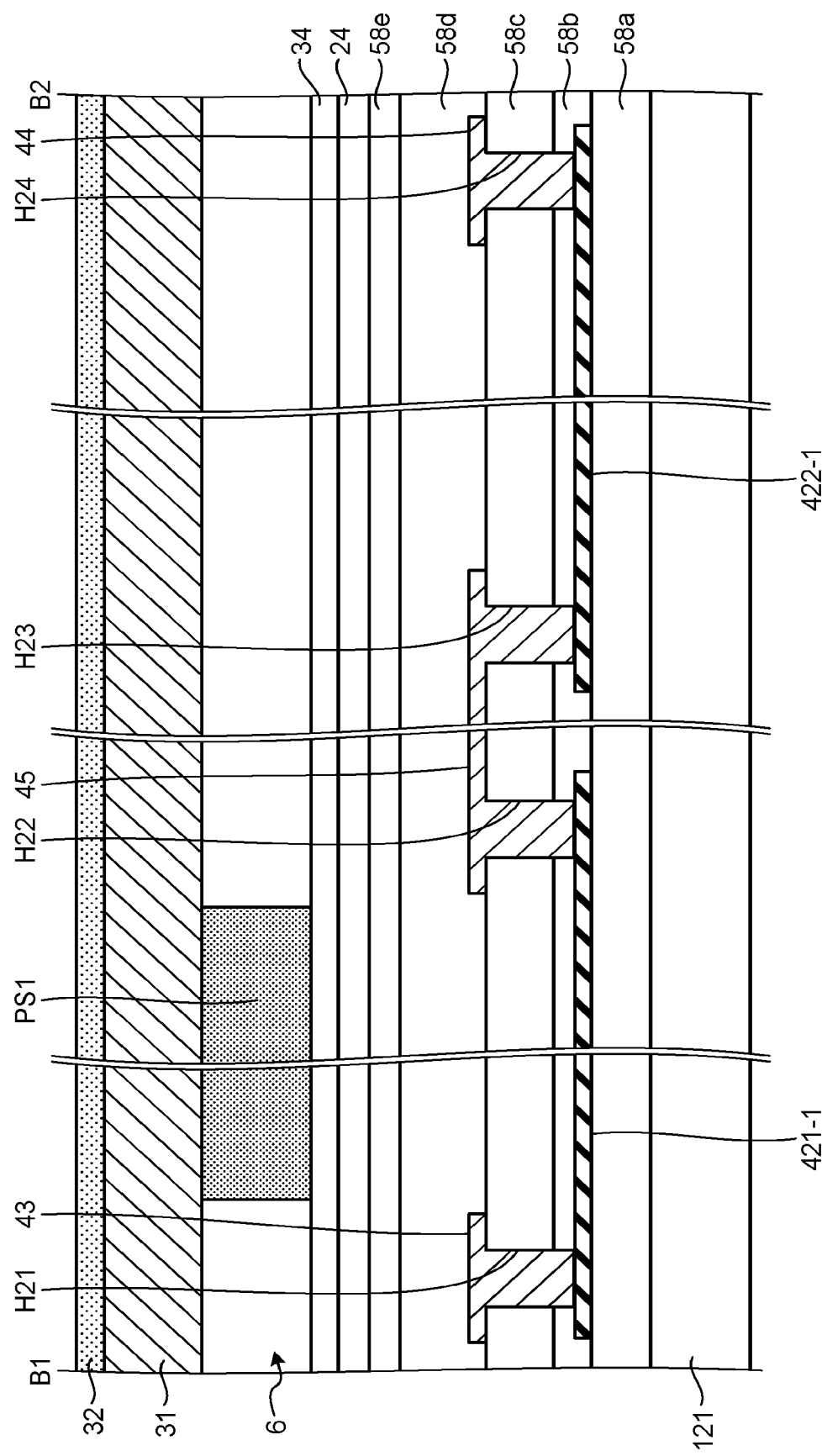
FIG. 8 is a sectional view along the B1-B2 line in FIG. 7.
Figure 9:
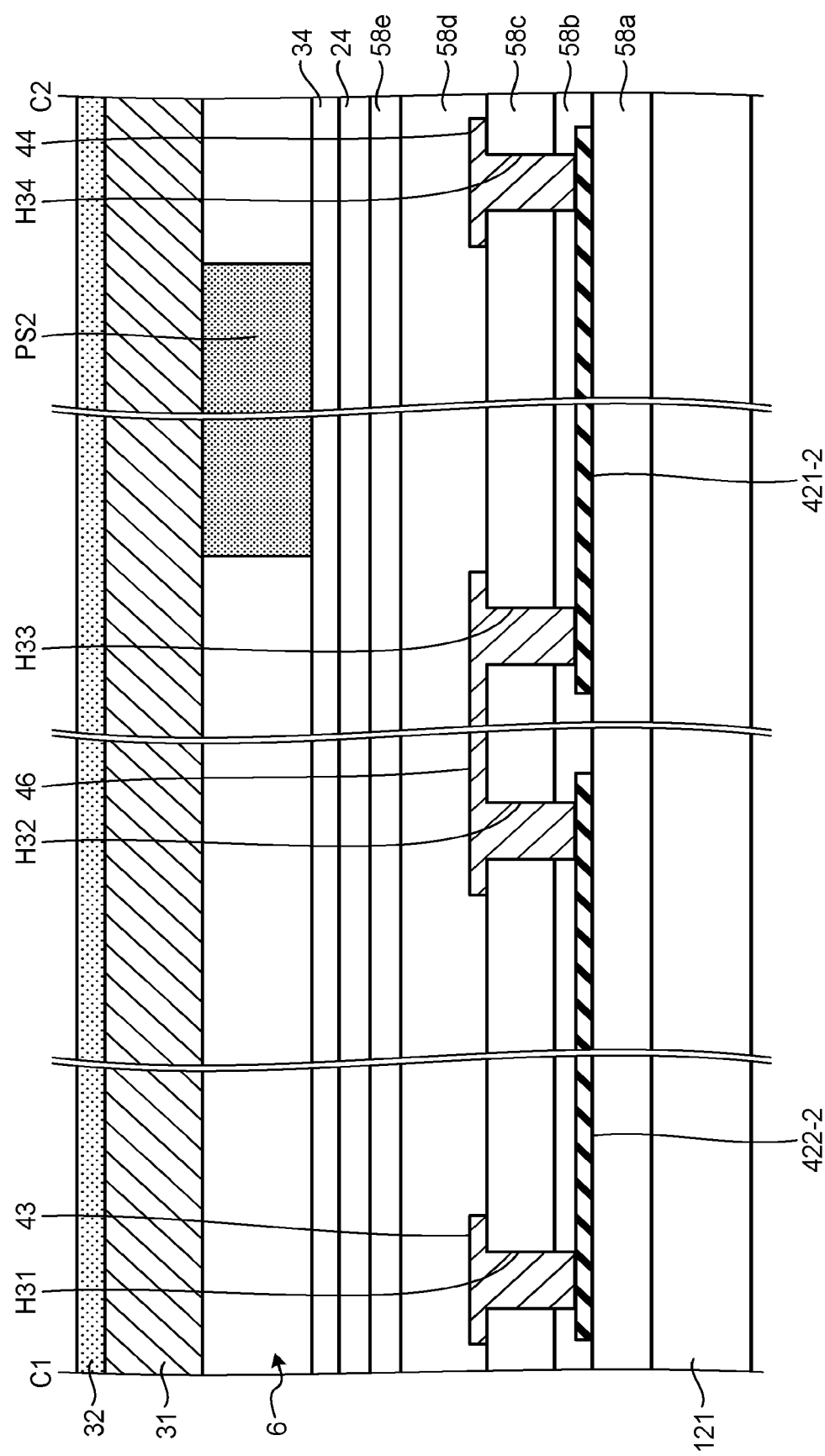
FIG. 9 is a sectional view along the C1-C2 line in FIG. 7.

FIG. 6 is an equivalent circuit diagram of a configuration example of the force detector according to the first embodiment. FIG. 7 is a plan view of a first configuration example of the sensor part according to the first embodiment. FIG. 8 is a sectional view along the B1-B2 line in FIG. 7. FIG. 9 is a sectional view along the C1-C2 line in FIG. 7.

As illustrated in FIG. 7 to FIG. 9, the sensor part 42 according to the first embodiment includes two first semiconductor resistance elements 421-1 and 421-2 and two second semiconductor resistance elements 422-1 and 422-2. The two first semiconductor resistance elements 421-1 and the two second semiconductor resistance elements 422-1 and 422-2 are provided as the same layer as the semiconductor layer 61 of the pixel transistor Tr. The first semiconductor resistance elements 421-1 and 421-2 form the first sensor 42-1 illustrated in FIG. 2. The second semiconductor resistance elements 422-1 and 422-2 form the second sensor 42-2 illustrated in FIG. 2. The "same layer" in the present specification means layers formed by the same process and of the same material.

One end of the first semiconductor resistance element 421-1 is connected to a wire 43 via a contact hole H21. The other end of the first semiconductor resistance element 421-1 is connected to a wire 45 provided as the same layer as the signal line SGL via contact hole H22.

One end of the second semiconductor resistance element 422-1 is connected to the wire 45 via a contact hole H23. The other end of the second semiconductor resistance element 422-1 is connected to a wire 44 provided as the same layer as the signal line SGL via a contact hole H24.

One end of the first semiconductor resistance element 421-2 is connected to the wire 43 via a contact hole H31. The other end of the first semiconductor resistance element 421-2 is connected to a wire 46 provided as the same layer as the signal line SGL via a contact hole H32.

One end of the second semiconductor resistance element 422-2 is connected to the wire 46 via a contact hole H33. The other end of the second semiconductor resistance element 422-2 is connected to the wire 44 provided as the same layer as the signal line SGL via a contact hole H34.

The first semiconductor resistance element 421-1 is provided overlapping with a spacer PS1. The first semiconductor resistance element 421-2 is provided overlapping with a spacer PS2. The second semiconductor resistance elements 422-1 and 422-2 are not overlapping with any spacer.

The first semiconductor resistance element 421-1 and the second semiconductor resistance element 422-1 are provided adjacent to each other in proximity, whereas the first semiconductor resistance element 421-2 and the second semiconductor resistance element 422-2 are provided adjacent to each other in proximity.

In the above configuration, a constant current source is connected between the wire 43 and the wire 44. A certain high potential VH is supplied to the wire 43, whereas a certain low potential VL is supplied to the wire 44, for example. The low potential VL can be a GND potential, for example.

The shape of the sensor part 42 in a plan view, including the shapes of the first semiconductor resistance elements 421-1 and 421-2 and the second semiconductor resistance elements 422-1 and 422-2, is not limited to the aspect illustrated in FIG. 7.

Although FIG. 7 to FIG. 9 exemplify a configuration in which the wire 43, the wire 44, the wire 45, and the wire 46 are provided as the same layer as the signal line SGL, the layer in which the wire 43, the wire 44, the wire 45, and the wire 46 are provided is not limited to this example and may be provided as the same layer as the auxiliary wire 54, for example. The layer in which the wire 43, the wire 44, the wire 45, and the wire 46 are provided does not limit the present disclosure.

Although FIG. 7 illustrates an example in which the wire 43, the wire 44, the wire 45, and the wire 46 are drawn to the lower side in the drawing, the drawing direction of the wire 44 and the wire 45 is not limited to this example.

The sensor part 42 configured as described above forms a Wheatstone bridge circuit illustrated in FIG. 6.

In the configuration illustrated in FIG. 6, the wire 45 and the wire 46 are connected to the detection circuit 41. The detection circuit 41 detects a force applied to the display region 11a based on output voltages VOUT1 and VOUT2 of the Wheatstone bridge circuit.

The first semiconductor resistance elements 421-1 and 421-2 can be regarded as variable resistances changing their resistance values by the force applied to the display region 11a via the spacers PS1 and PS2.

The second semiconductor resistance elements 422-1 and 422-2 have electric characteristics similar to those of the first semiconductor resistance elements 421-1 and 421-2. That is to say, the resistance values of the second semiconductor resistance elements 422-1 and 422-2 are equivalent to the resistance values of the first semiconductor resistance elements 421-1 and 421-2 when no force is applied to the display region 11a. As illustrated in FIG. 7, the second semiconductor resistance elements 422-1 and 422-2 can be regarded as reference resistances of the first semiconductor resistance elements 421-1 and 421-2 by being placed adjacent to the first semiconductor resistance elements 421-1 and 421-2.

As illustrated in FIG. 6, the two first semiconductor resistance elements 421-1 and 421-2 and the two second semiconductor resistance elements 422-1 and 422-2 form the Wheatstone bridge circuit, whereby the potential difference between the output voltages VOUT1 and VOUT2 is a value with the influence by temperature changes cancelled. Thus, the force detector 40 according to the present embodiment can detect a force applied to the display region 11a with high precision.

Specifically, when a force is applied to the display region 11a, the force is applied to the first semiconductor resistance element 421-1 via the spacer PS1, whereas the force is applied to the first semiconductor resistance element 421-2 via the spacer PS2. Thus, the resistance values of the first semiconductor resistance elements 421-1 and 421-2 change, and the midpoint voltage VOUT1 between the first semiconductor resistance element 421-1 and the second semiconductor resistance element 422-1 and the midpoint voltage VOUT2 between the first semiconductor resistance element 421-2 and the second semiconductor resistance element 422-2 change. The detection circuit 41 detects the potential difference between the midpoint voltage VOUT1 between the first semiconductor resistance element 421-1 and the second semiconductor resistance element 422-1 and the midpoint voltage VOUT2 between the first semiconductor resistance element 421-2 and the second semiconductor resistance element 422-2, and can thereby detect the force applied to the display region 11a with high precision.

The detection circuit 41 may detect the force applied to the display region 11a based on the midpoint voltage between the first semiconductor resistance element 421-1 and the second semiconductor resistance element 422-1. In this case, the first semiconductor resistance element 421-2 and the second semiconductor resistance element 422-2 are unnecessary. However, to obtain a high-precision detection result with the influence by temperature changes cancelled, the force applied to the display region 11a is desirably detected by forming the Wheatstone bridge circuit by the two first semiconductor resistance elements 421-1 and 421-2 and the two second semiconductor resistance elements 422-1 and 422-2 as illustrated in FIG. 6 and, as described above, using the potential difference between the midpoint voltage VOUT1 between the first semiconductor resistance element 421-1 and the second semiconductor resistance element 422-1 and the midpoint voltage VOUT2 between the first semiconductor resistance element 421-2 and the second semiconductor resistance element 422-2.

Figure 10:
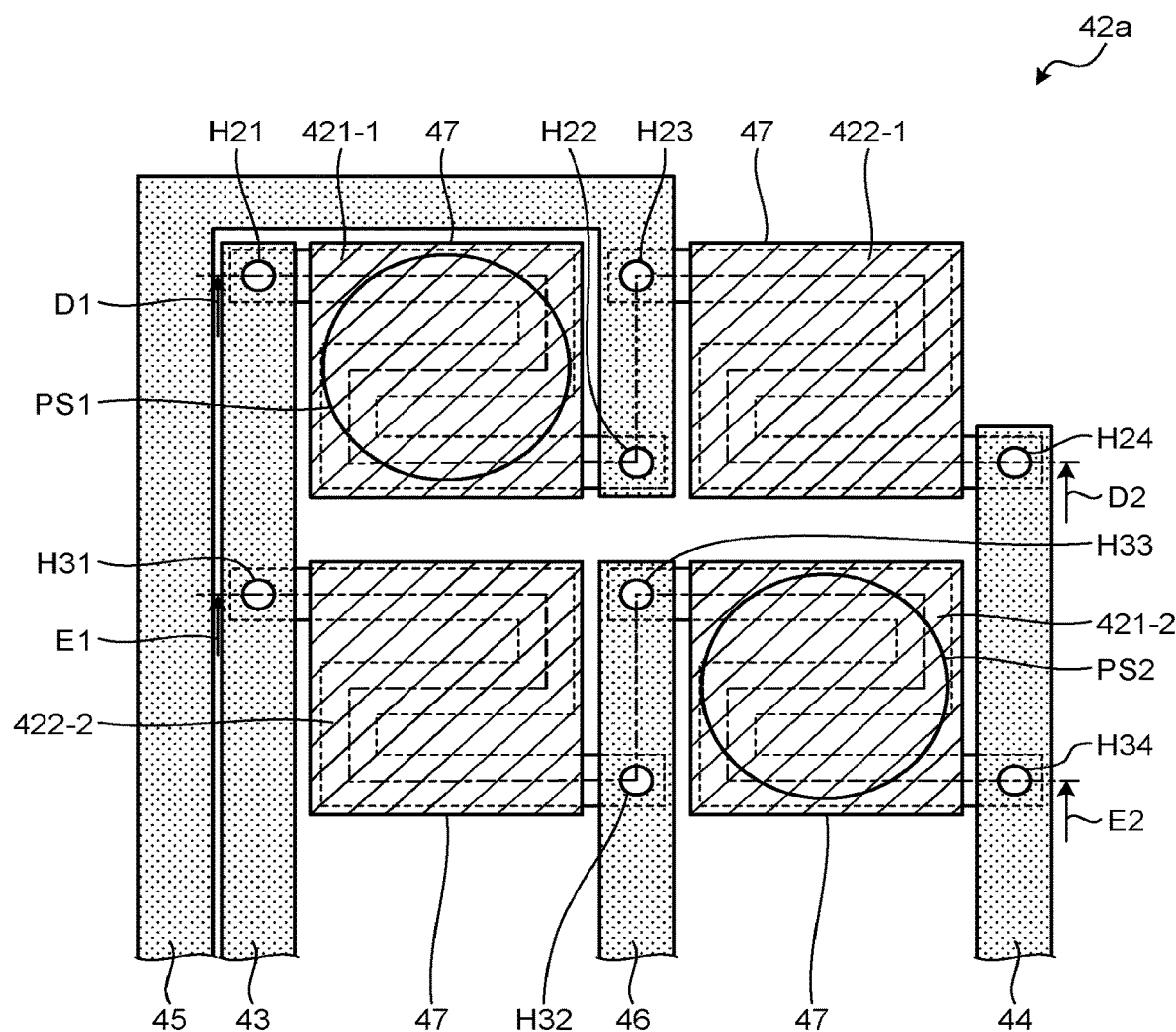
FIG. 10 is a plan view of a second configuration example of the sensor part according to the first embodiment.
Figure 11:
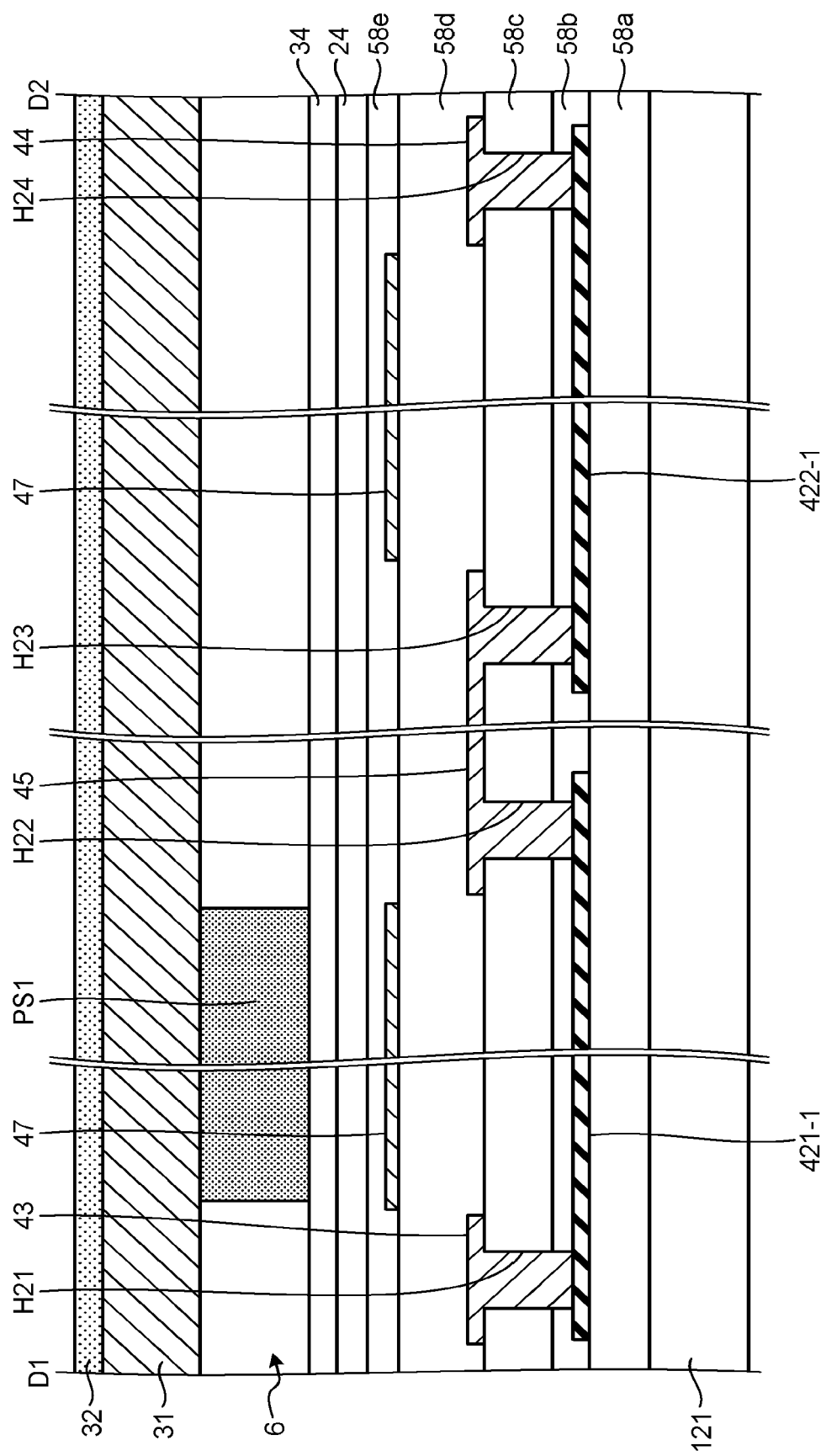
FIG. 11 is a sectional view along the D1-D2 line in FIG. 10.
Figure 12:
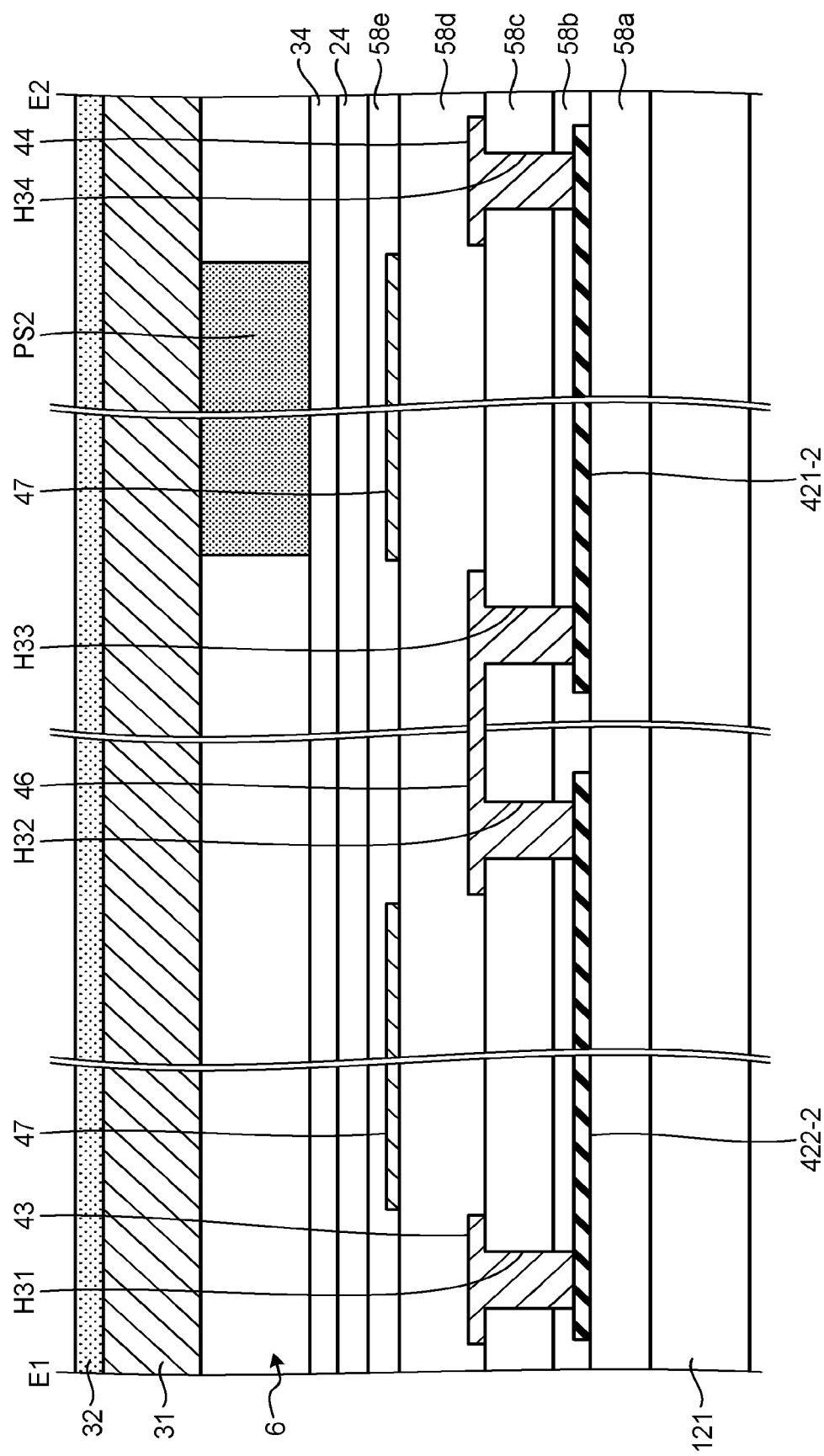
FIG. 12 is a sectional view along the E1-E2 line in FIG. 10.

FIG. 10 is a plan view of a second configuration example of the sensor part according to the first embodiment. FIG. 11 is a sectional view along the D1-D2 line in FIG. 10. FIG. 12 is a sectional view along the E1-E2 line in FIG. 10.

As illustrated in FIG. 10 to FIG. 12, the second configuration example of the first embodiment illustrated in FIG. 10 is different from the first configuration example illustrated in FIG. 7 in that a metallic film 47 overlapping with the first semiconductor resistance elements 421-1 and 421-2 is provided between the first semiconductor resistance element 421-1 and the spacer PS1 and between the first semiconductor resistance element 421-2 and the spacer PS2.

As illustrated in FIG. 11 and FIG. 12, the metallic film 47 is provided as the same layer as the auxiliary wire 54. The metallic film 47 is provided, whereby the electric characteristics of the first semiconductor resistance elements 421-1 and 421-2 and the second semiconductor resistance elements 422-1 and 422-2 may change. Thus, in the present embodiment, the metallic film 47 is provided overlapping also with the second semiconductor resistance elements 422-1 and 422-2.

The metallic film 47 is provided between the first semiconductor resistance element 421-1 and the spacer PS1 and between the first semiconductor resistance element 421-2 and the spacer PS2, whereby the force applied to the display region 11a is easily transmitted to the first semiconductor resistance elements 421-1 and 421-2. Thus, the detection accuracy of the force applied to the display region 11a improves.

As described in the foregoing, the display device 1 according to the first embodiment includes the first substrate 2, the second substrate 3 placed facing the first substrate 2, and the spacers PS (PS1 and PS2) provided between the first substrate 2 and the second substrate 3. The first substrate 2 includes the display region 11a in which the pixels Pix are arrayed in the row direction (the Dx direction) and the column direction (the Dy direction), the gate lines GCL extending in the row direction (the Dx direction) and connected to the pixels Pix, the signal lines SGL extending in the column direction (the Dy direction) and connected to the pixels Pix, the pixel transistors Tr provided in the respective pixels Pix and each having the semiconductor layer 61, the first semiconductor resistance element 421-1 (421-2) overlapping with the spacer PS1 (PS2) and provided as the same layer as the semiconductor of the pixel transistors Tr, the second semiconductor resistance element 422-1 (422-2) provided as the same layer as the semiconductor layer 61 of the pixel transistors Tr and not overlapping with any of the spacers, and the detection circuit 41 detecting the force applied to the display region 11a based on the midpoint voltage VOUT1 (VOUT2) between the first semiconductor resistance element 421-1 (421-2) and the second semiconductor resistance element 422-1 (422-2). The resistance value of the second semiconductor resistance element 422-1 (422-2) is equivalent to the resistance value of the first semiconductor resistance element 421-1 (421-2) when no force is applied.

In the above configuration, the sensor part 42 is formed by the first semiconductor resistance element 421-1 (421-2) and the second semiconductor resistance element 422-1 (422-2) provided as the same layer as the semiconductor layer 61 of the pixel transistors Tr, whereby a configuration for detecting the force applied to the display region 11a at a low cost can be obtained.

The sensor part 42 is placed in the frame region 11b outside the display region 11a, whereby the gauge length of the first semiconductor resistance element 421-1 (421-2) and the second semiconductor resistance element 422-1 (422-2) can be increased. Thus, the resistance values of the first semiconductor resistance element 421-1 (421-2) and the second semiconductor resistance element 422-1 (422-2) can be increased, and variations in the resistance values of the first semiconductor resistance element 421-1 (421-2) and the second semiconductor resistance element 422-1 (422-2) can be relatively reduced. The area of the spacer PS1 (PS2) is made to be a size corresponding to the gauge length of the first semiconductor resistance element 421-1 (421-2), whereby a change in the resistance value of the first semiconductor resistance element 421-1 (421-2) when the force is applied to the display region 11a can be increased. Thus, a change in the midpoint voltage VOUT1 (VOUT2) between the first semiconductor resistance element 421-1 (421-2) and the second semiconductor resistance element 422-1 (422-2) can be increased, and the detection accuracy of the force applied to the display region 11a improves.

The metallic film 47 overlapping with the first semiconductor resistance element 421-1 (421-2) is provided between the first semiconductor resistance element 421-1 (421-2) and the spacer PS1 (PS2), whereby the force applied to the display region 11a is efficiently transmitted to the first semiconductor resistance element 421-1 (421-2). Thus, the detection accuracy of the force applied to the display region 11a improves.

The Wheatstone bridge circuit is formed by the two first semiconductor resistance elements 421-1 and 421-2 and the two second semiconductor resistance elements 422-1 and 422-2, whereby the force applied to the display region 11a can be detected with high precision.

According to the present embodiment, a configuration for detecting the force applied to the display region at a low cost can be obtained.

Second Embodiment

Figure 13:
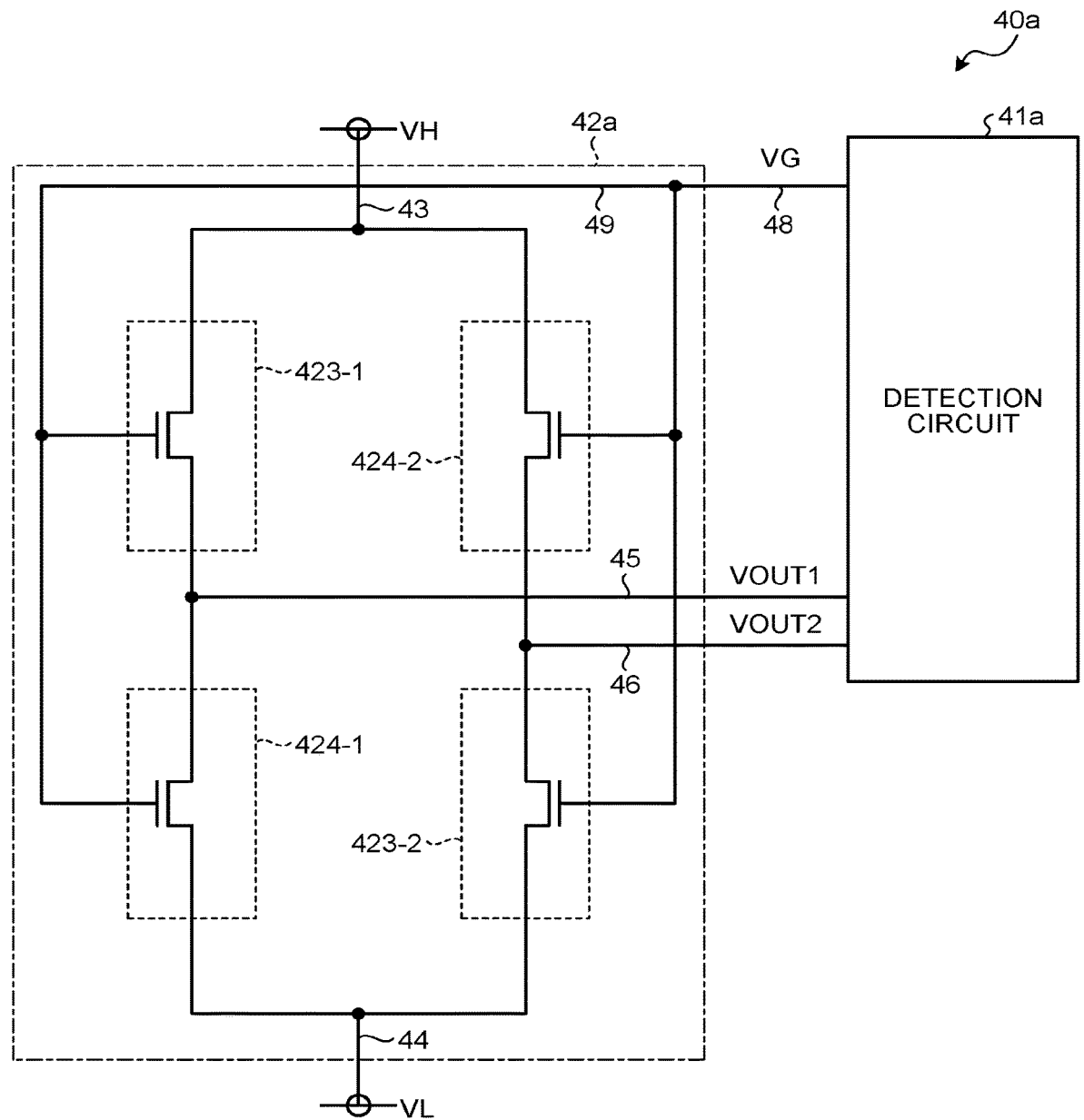
FIG. 13 is a block diagram of a configuration example of a force detector according to a second embodiment.
Figure 14:
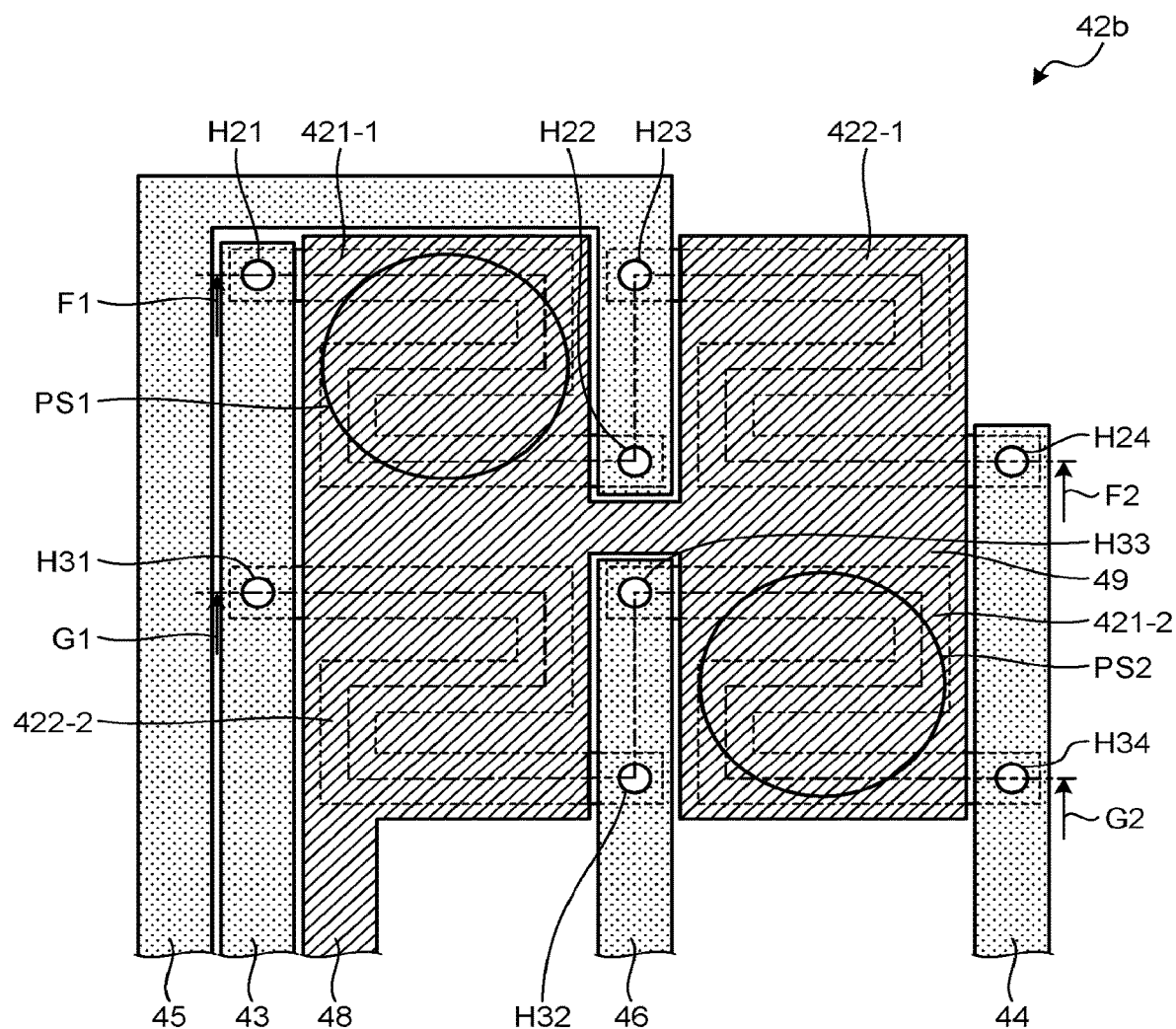
FIG. 14 is a plan view of a first configuration example of a sensor part according to the second embodiment.
Figure 15:
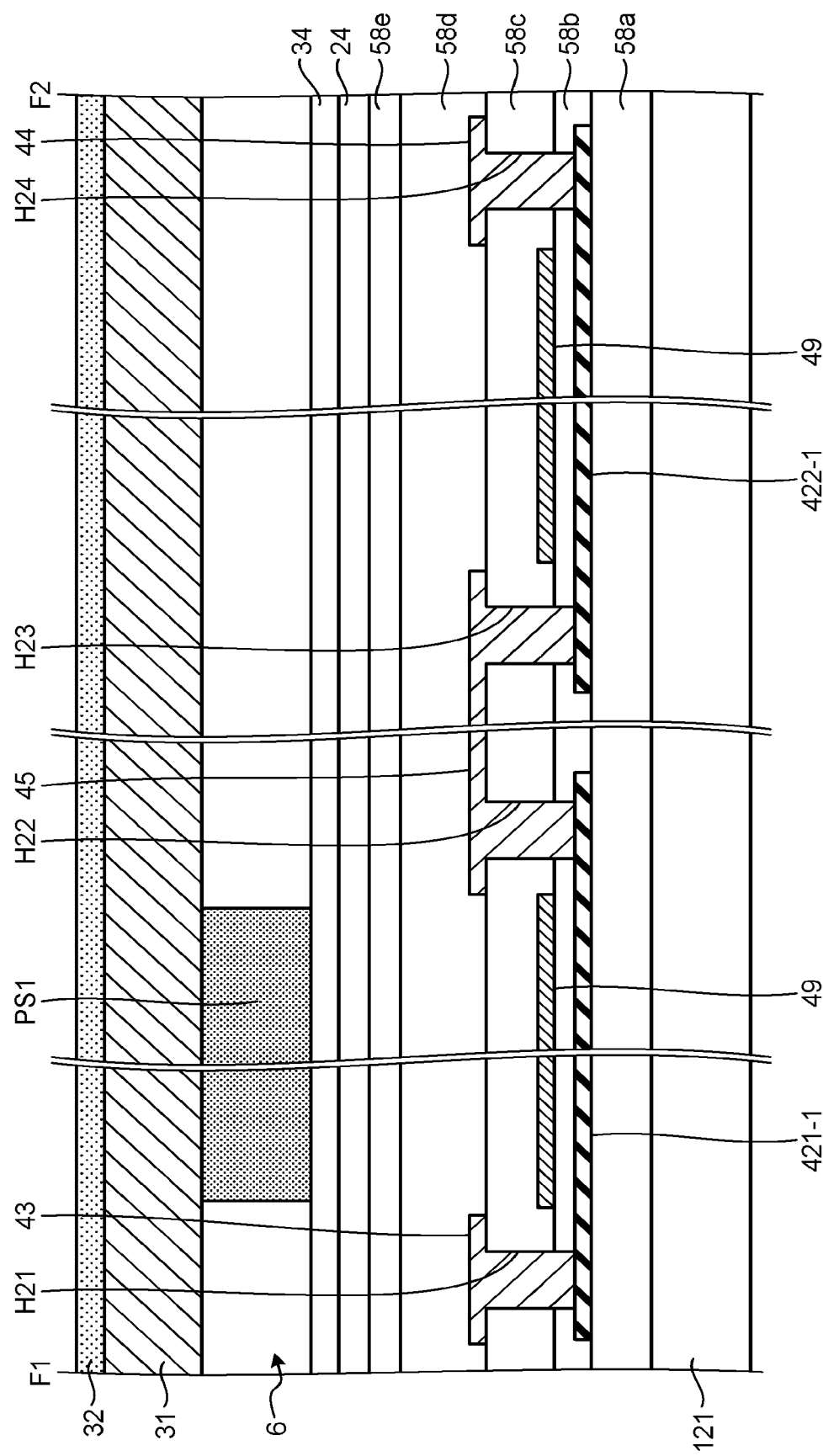
FIG. 15 is a sectional view along the F1-F2 line in FIG. 14.
Figure 16:
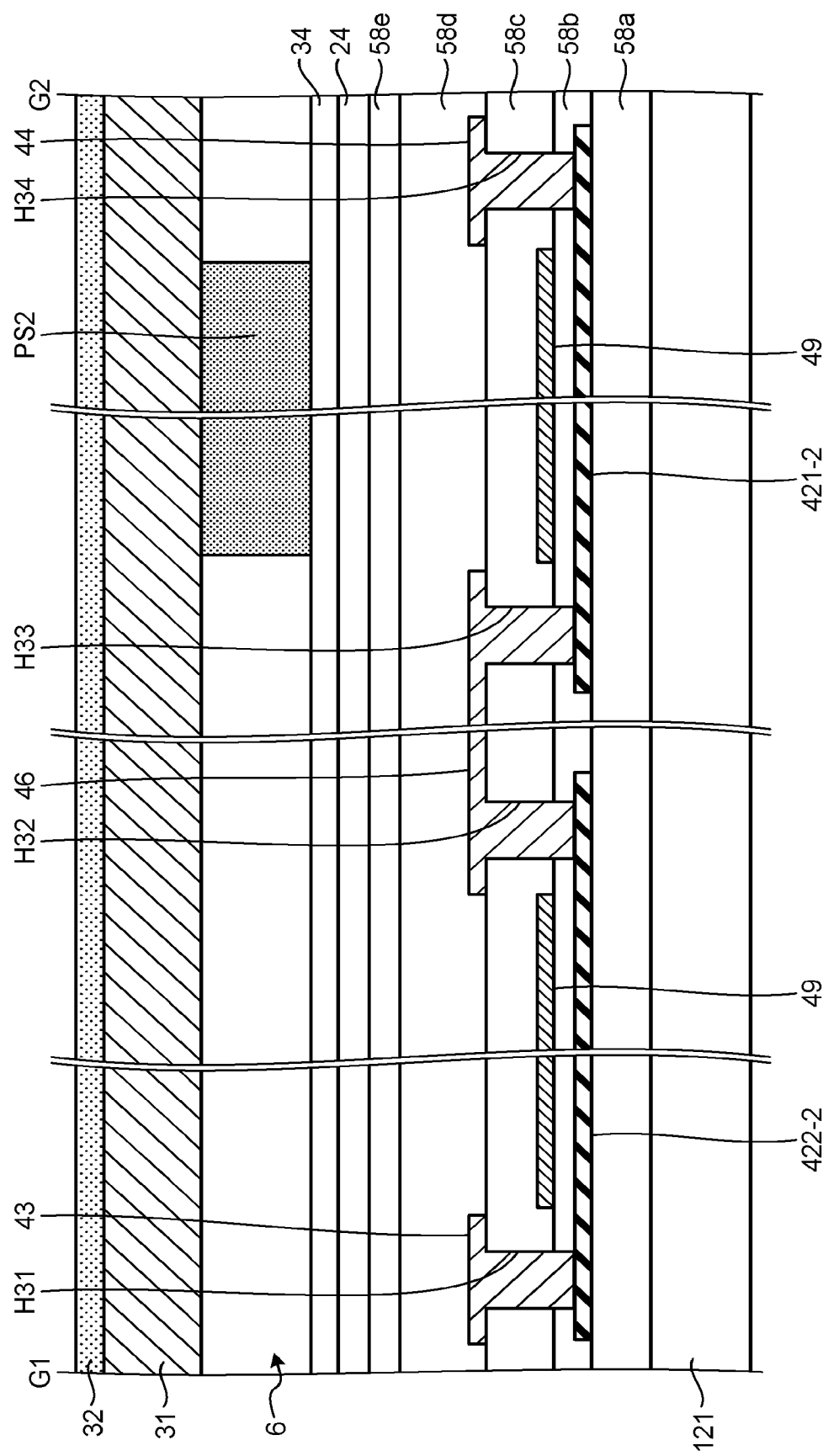
FIG. 16 is a sectional view along the G1-G2 line in FIG. 14.

FIG. 13 is a block diagram of a configuration example of a force detector according to a second embodiment. FIG. 14 is a plan view of a first configuration example of a sensor part according to the second embodiment. FIG. 15 is a sectional view along the F1-F2 line in FIG. 14. FIG. 16 is a sectional view along the G1-G2 line in FIG. 14. For components similar to or the same as those of the first embodiment described above, a duplicate description is omitted.

As illustrated in FIG. 14 to FIG. 16, this sensor part 42a of this force detector 40a according to the second embodiment is different from the first configuration example of the first embodiment illustrated in FIG. 7 to FIG. 9 in that an electrode (a gate electrode) 49 overlapping with the first semiconductor resistance elements 421-1 and 421-2 and the second semiconductor resistance elements 422-1 and 422-2 is included. The electrode 49 is provided as the same layer as the gate line GCL.

With the above configuration, the first semiconductor resistance element 421-1 and the electrode 49 form a TFT transistor (a transistor element) 423-1 illustrated in FIG. 13. The first semiconductor resistance element 421-2 and the electrode 49 form a TFT transistor (a transistor element) 423-2 illustrated in FIG. 13. The second semiconductor resistance element 422-1 and the electrode 49 form a TFT transistor (a transistor element) 424-1 illustrated in FIG. 13. The second semiconductor resistance element 422-2 and the electrode 49 form a TFT transistor (a transistor element) 424-2 illustrated in FIG. 13. A current corresponding to a gate voltage VG applied to the electrode 49 passes through each of the TFT transistors 423-1, 423-2, 424-1, and 424-2.

As illustrated in FIG. 13, the gate voltage VG may be applied from a detection circuit 41a via a wire 48 or be applied from another component different from the detection circuit 41a, for example. The component applying the gate voltage VG does not limit the present disclosure.

Although FIG. 13 illustrates an example in which the wire 48 is drawn to the lower side in the drawing similarly to the wire 43, the wire 44, the wire 45, and the wire 46, the drawing direction of the wire 48 is not limited to this example.

Figure 17:
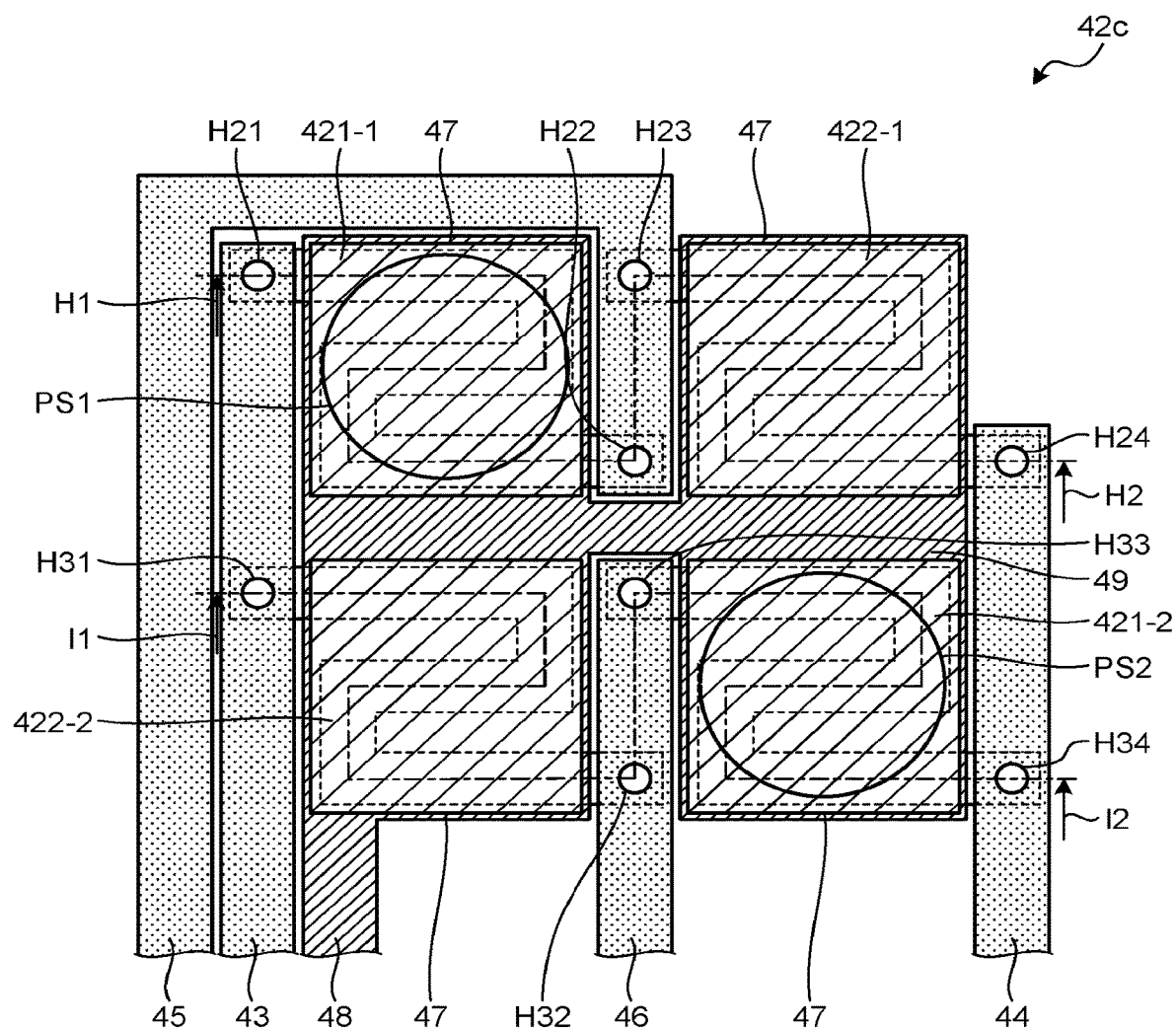
FIG. 17 is a plan view of a second configuration example of the sensor part according to the second embodiment.
Figure 18:
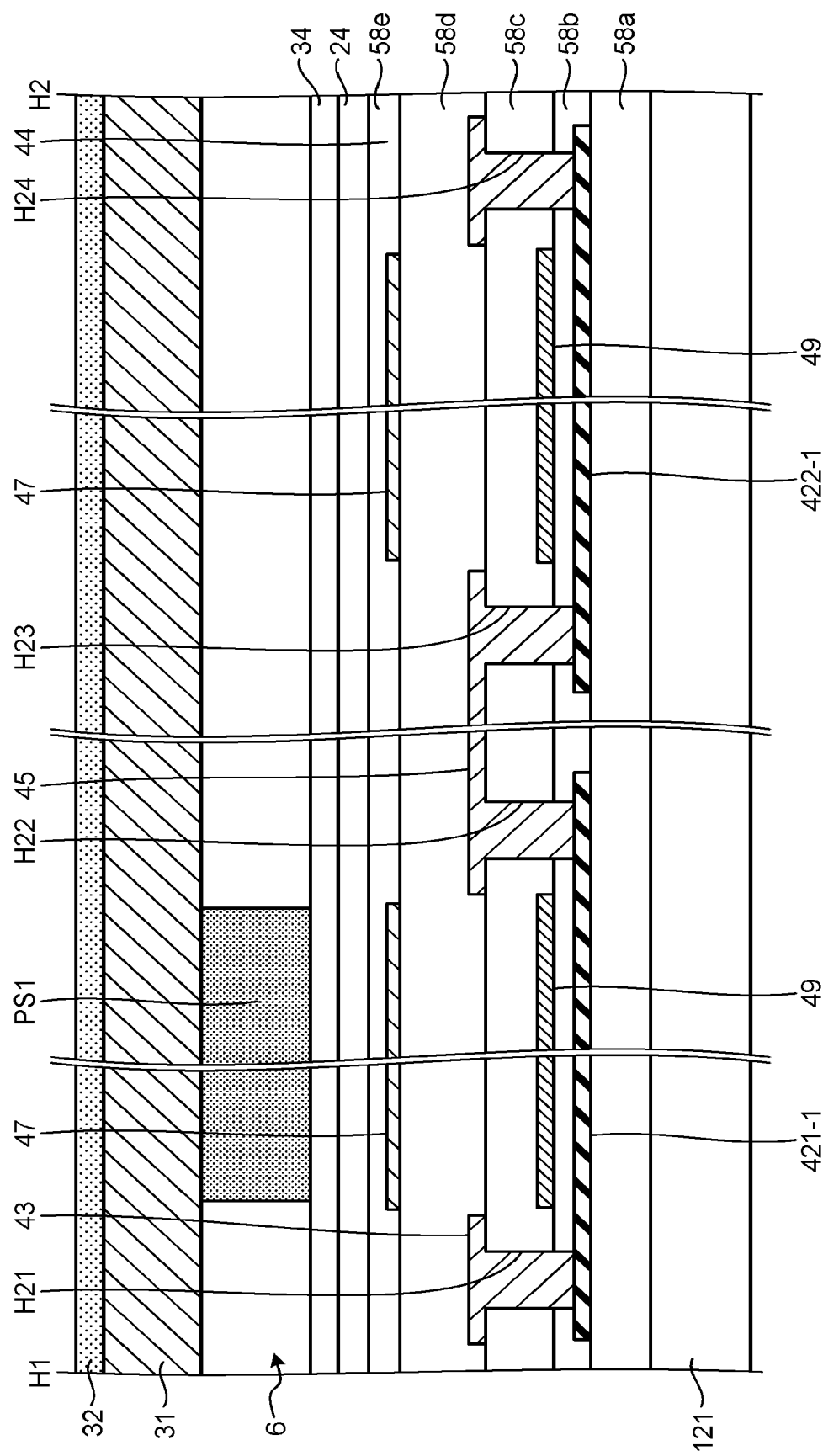
FIG. 18 is a sectional view along the H1-H2 line in FIG. 17.
Figure 19:
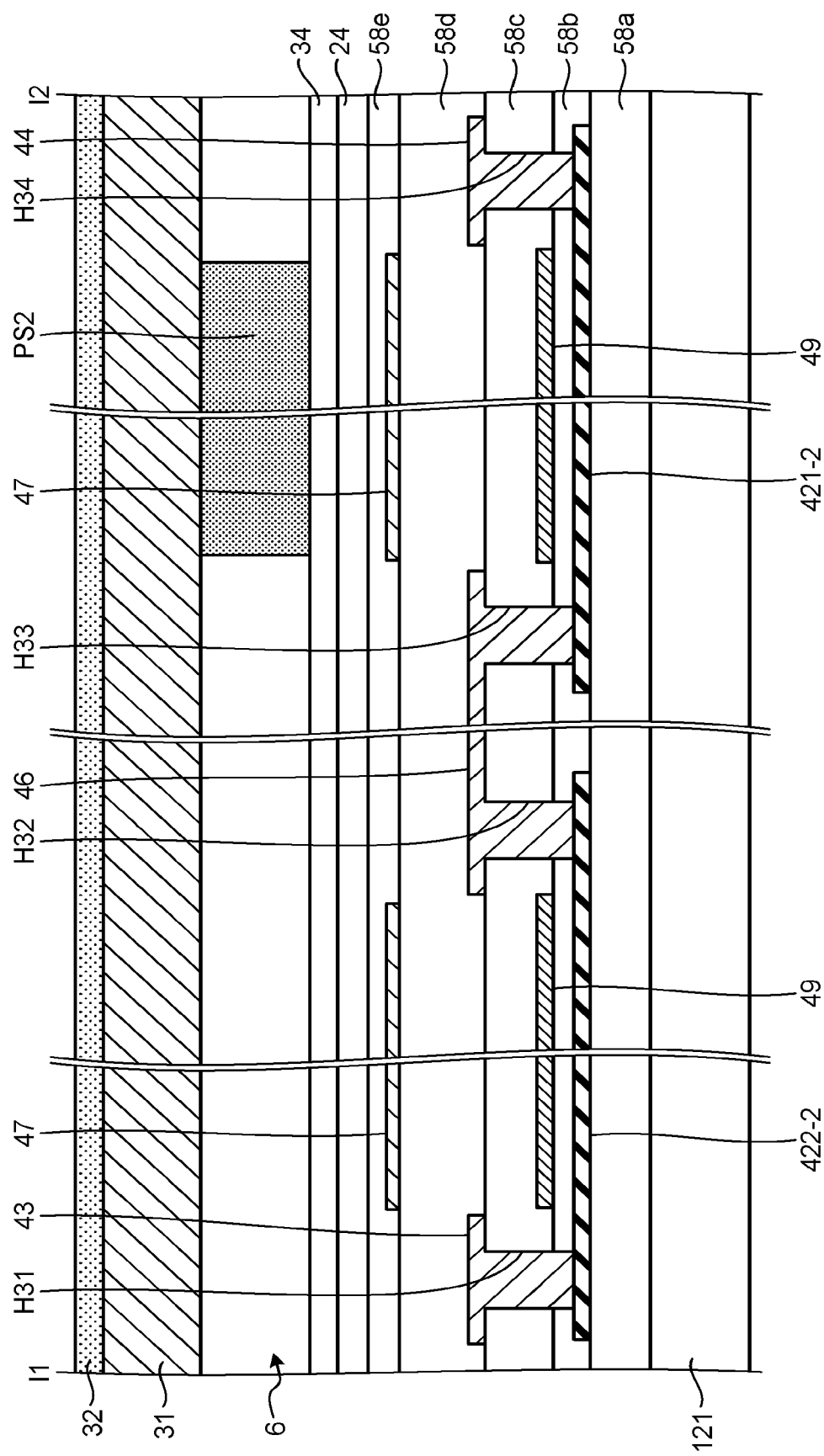
FIG. 19 is a sectional view along the I1-I2 line in FIG. 17.

FIG. 17 is a plan view of a second configuration example of the sensor part according to the second embodiment. FIG. 18 is a sectional view along the H1-H2 line in FIG. 17. FIG. 19 is a sectional view along the I1-I2 line in FIG. 17.

As illustrated in FIG. 17 to FIG. 19, the second configuration example of the second embodiment illustrated in FIG. 17 is different from the first configuration example illustrated in FIG. 14 in that the metallic film 47 overlapping with the first semiconductor resistance elements 421-1 and 421-2 is provided between the first semiconductor resistance element 421-1 and the spacer PS1 and between the first semiconductor resistance element 421-2 and the spacer PS2 similarly to the second configuration example of the first embodiment.

As illustrated in FIG. 18 and FIG. 19, the metallic film 47 is provided as the same layer as the auxiliary wire 54. Similarly to the second configuration example of the first embodiment, the metallic film 47 is provided overlapping also with the second semiconductor resistance elements 422-1 and 422-2.

The metallic film 47 is provided between the first semiconductor resistance element 421-1 and the spacer PS1 and between the first semiconductor resistance element 421-2 and the spacer PS2, whereby the force applied to the display region 11a is efficiently transmitted to the first semiconductor resistance elements 421-1 and 421-2. Thus, the detection accuracy of the force applied to the display region 11a improves.

Figure 20:
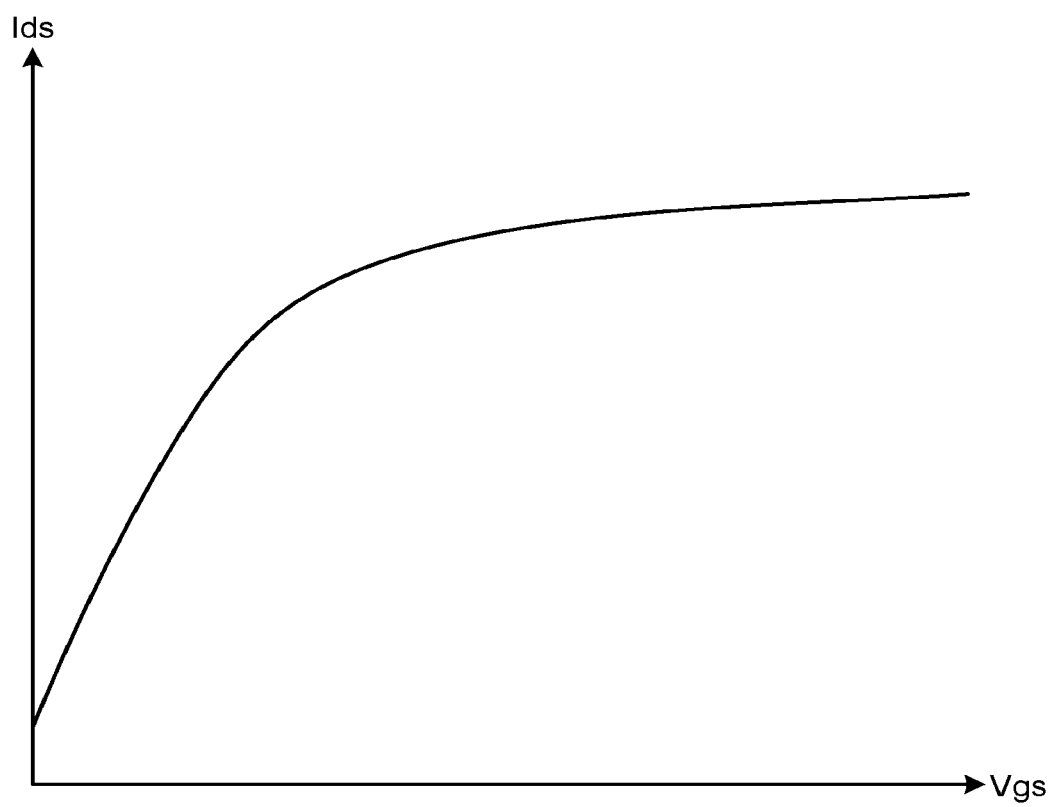
FIG. 20 is a diagram of a relation between a gate-source voltage and a drain-source current of a TFT transistor.

FIG. 20 is a diagram of a relation between a gate-source voltage and a drain-source current of a TFT transistor. As illustrated in FIG. 20, a drain-source current Ids changes in accordance with a gate-source voltage Vgs. That is to say, the gate-source voltage Vgs is changed, whereby the on resistance of the TFT transistor changes.

In the present embodiment, the gate voltage VG (refer to FIG. 13) is adjusted, whereby the resistance values of the first semiconductor resistance elements 421-1 and 421-2 and the second semiconductor resistance elements 422-1 and 422-2 can be changed. Thus, the gate voltage VG is made to be a different value for each of sensor parts 42a placed at a plurality of places, for example, whereby a detection value for the force applied to the display region 11a can be substantially constant.

As described in the foregoing, in the second embodiment, in the sensor part 42a, the electrode (the gate electrode) 49 provided as the same layer as the gate line GCL overlaps with the first semiconductor resistance elements 421-1 and 421-2 and the second semiconductor resistance elements 422-1 and 422-2 to form the TFT transistors (the transistor elements) 423-1, 423-2, 424-1, and 424-2.

Thus, by using the TFT transistors (the transistor elements) 423-1, 423-2, 424-1, and 424-2 formed by the first semiconductor resistance elements 421-1 and 421-2 and the second semiconductor resistance elements 422-1 and 422-2, the force applied to the display region 11a can be detected.

According to the present embodiment, a configuration for detecting the force applied to the display region at a low cost can be obtained.

Modifications

Figure 21:
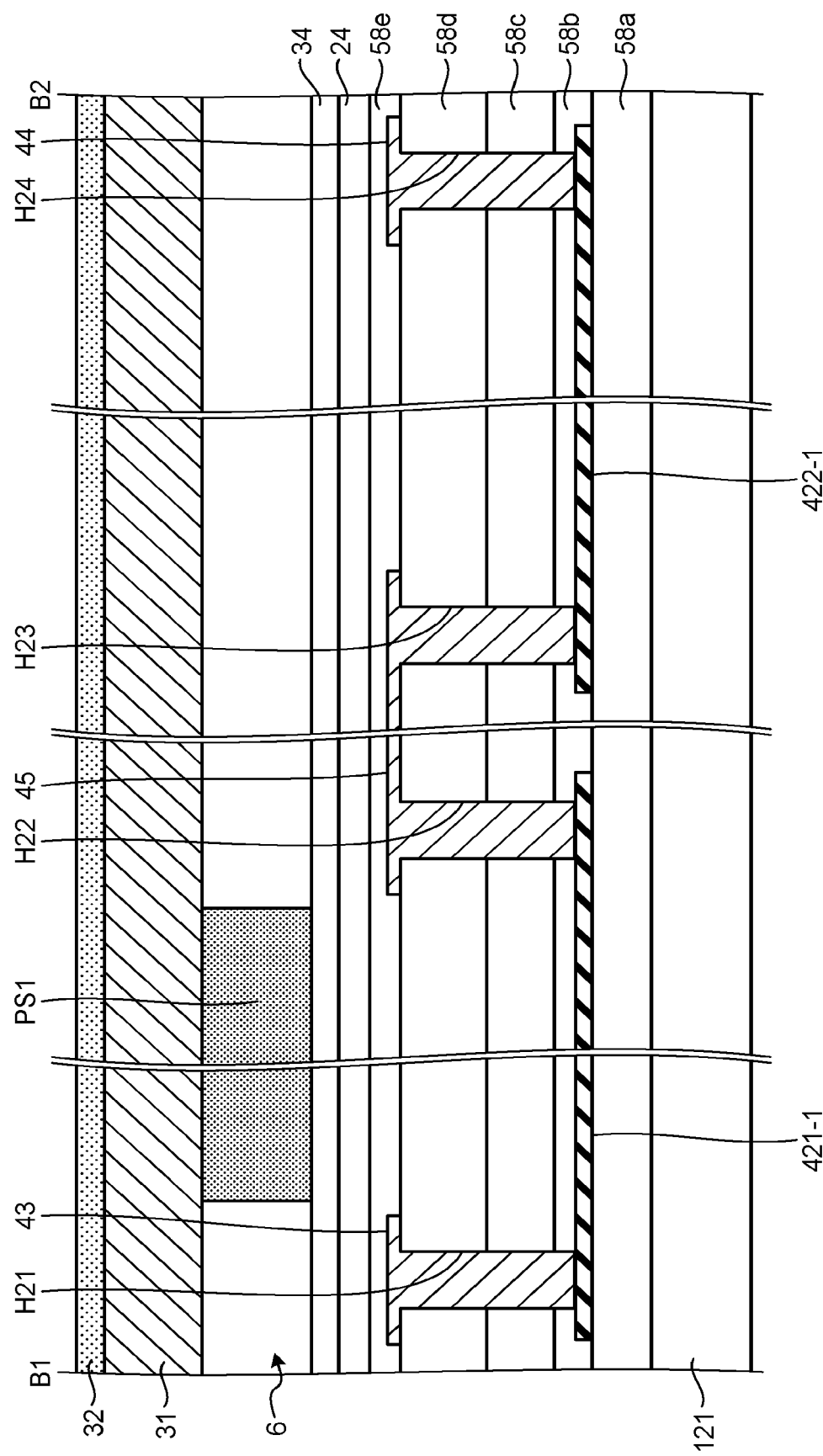
FIG. 21 is a sectional view illustrating a modification to FIG. 8 in which wires are provided as the same layer as an auxiliary wire.
Figure 22:
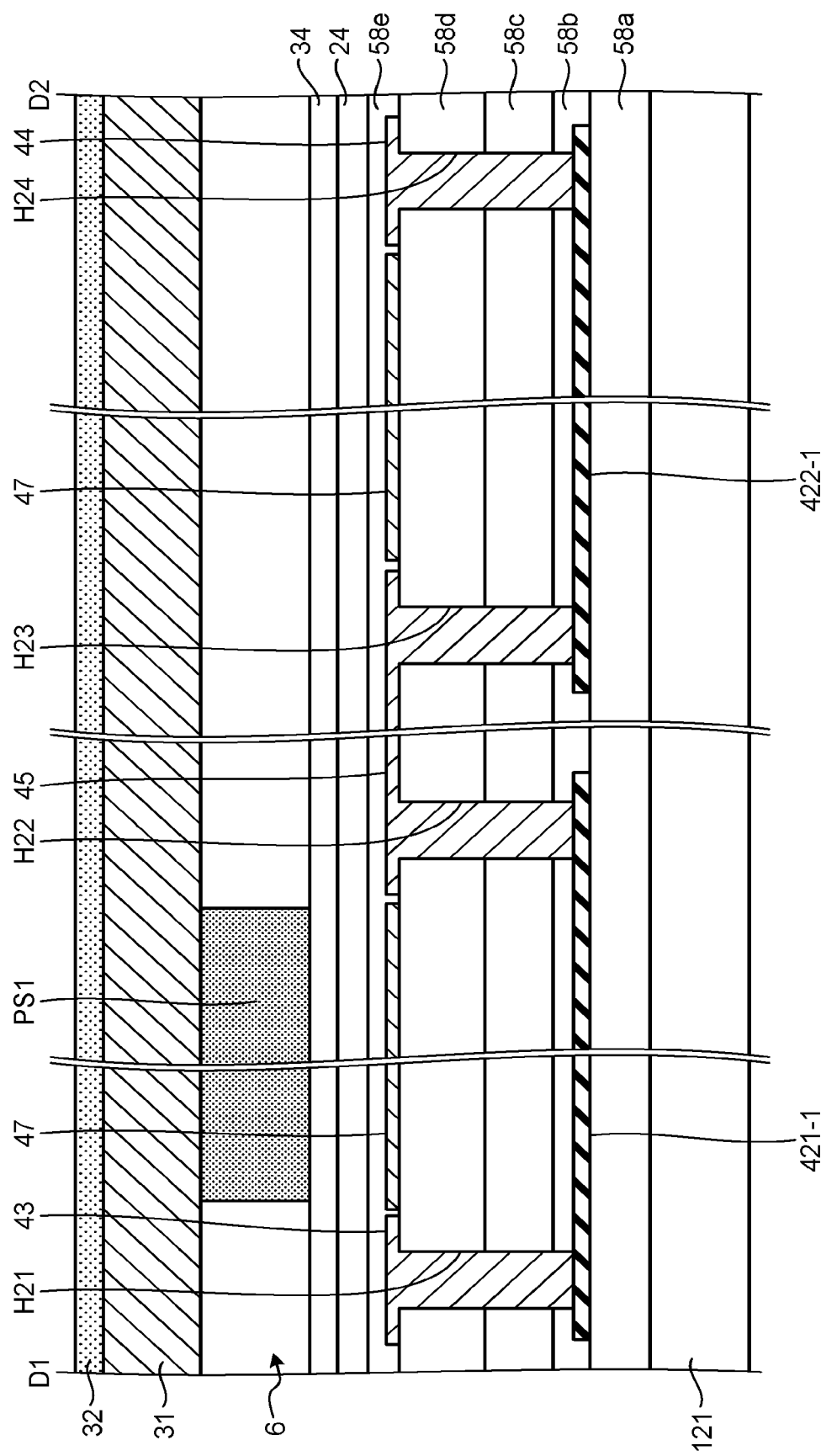
FIG. 22 is a sectional view illustrating a modification to FIG. 11 in which the wires are provided as the same layer as the auxiliary wire.
Figure 23:
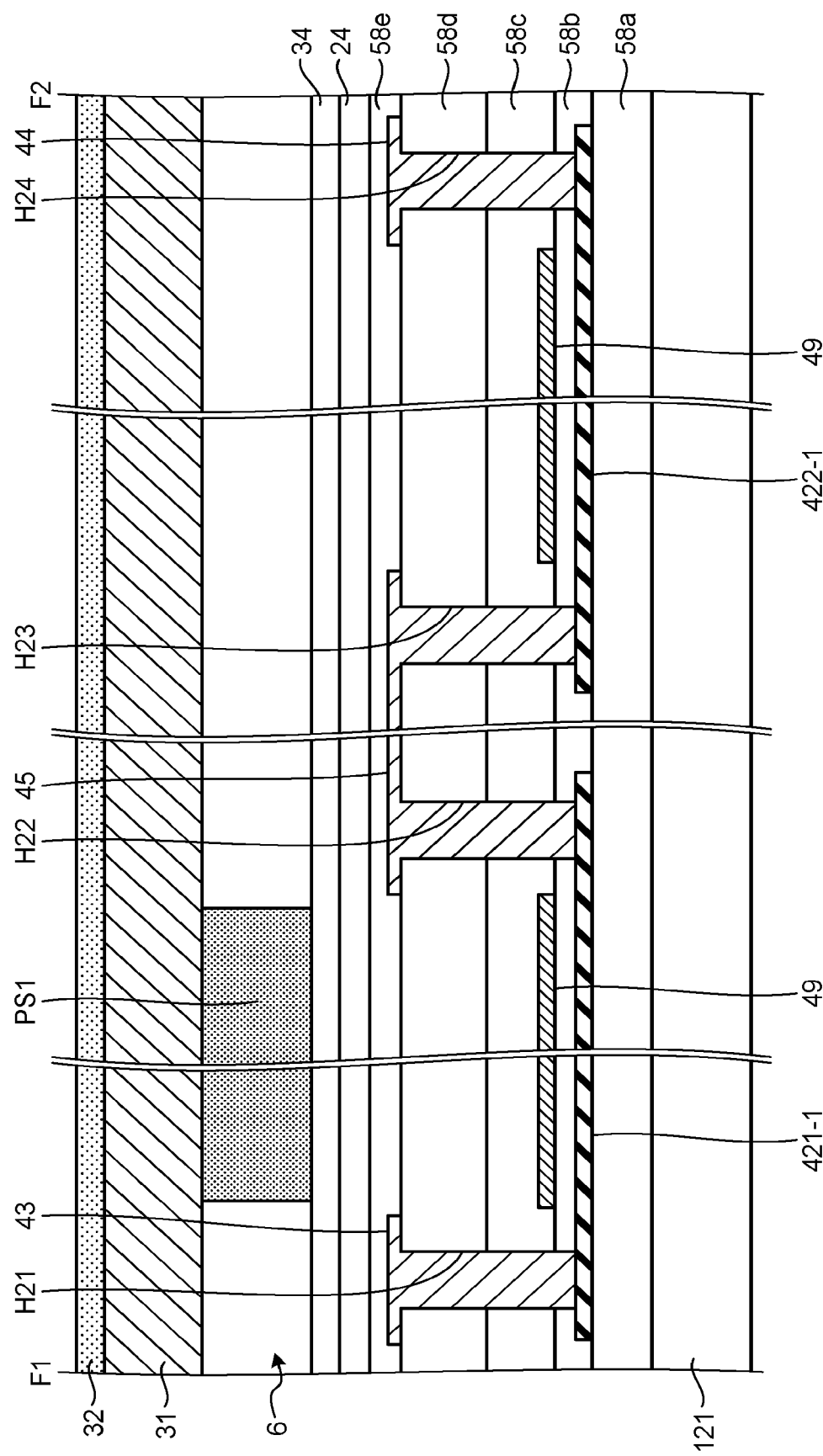
FIG. 23 is a sectional view illustrating a modification to FIG. 15 in which the wires are provided as the same layer as the auxiliary wire.
Figure 24:
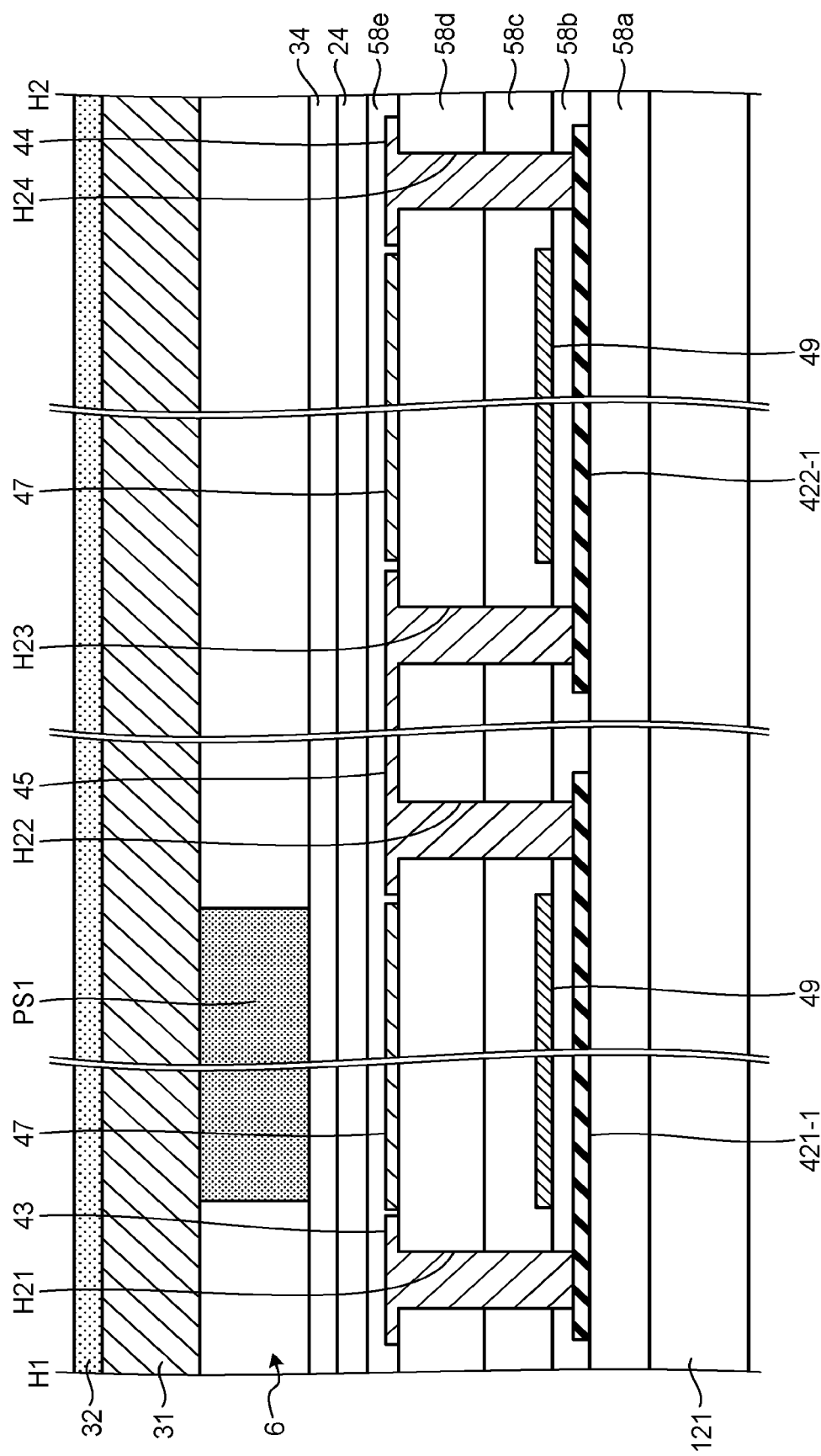
FIG. 24 is a sectional view illustrating a modification to FIG. 18 in which the wires are provided as the same layer as the auxiliary wire.

FIG. 21 is a sectional view illustrating a modification to FIG. 8 in which the wires connected to the first semiconductor resistance element and the second semiconductor resistance element are provided as the same layer as the auxiliary wire. FIG. 22 is a sectional view illustrating a modification to FIG. 11 in which the wires connected to the first semiconductor resistance element and the second semiconductor resistance element are provided as the same layer as the auxiliary wire. FIG. 23 is a sectional view illustrating a modification to FIG. 15 in which the wires connected to the first semiconductor resistance element and the second semiconductor resistance element are provided as the same layer as the auxiliary wire. FIG. 24 is a sectional view illustrating a modification to FIG. 18 in which the wires connected to the first semiconductor resistance element and the second semiconductor resistance element are provided as the same layer as the auxiliary wire. A sectional view illustrating a modification to FIG. 9 in which the wires connected to the first semiconductor resistance element and the second semiconductor resistance element are provided as the same layer as the auxiliary wire, a sectional view illustrating a modification to FIG. 12 in which the wires connected to the first semiconductor resistance element and the second semiconductor resistance element are provided as the same layer as the auxiliary wire, a sectional view illustrating a modification to FIG. 16 in which the wires connected to the first semiconductor resistance element and the second semiconductor resistance element are provided as the same layer as the auxiliary wire, and a sectional view illustrating a modification to FIG. 19 in which the wires connected to the first semiconductor resistance element and the second semiconductor resistance element are provided as the same layer as the auxiliary wire are regarded as having the same layer structures as those in FIG. 21, FIG. 22, FIG. 23, and FIG. 24, respectively, and illustration thereof is omitted here.

As illustrated in FIG. 21 to FIG. 24, also when the wires connected to the first semiconductor resistance element 421-1 (421-2) and the second semiconductor resistance element 422-1 (422-2) are provided as the same layer as the auxiliary wire 54, an effect similar to that of the embodiments described above can be produced.

Preferred embodiments of the present invention have been described; however, the present invention is not limited to such embodiments. The details disclosed in the embodiments are merely by way of example, and various modifications can be made in a range not departing from the gist of the present invention. Although the first embodiment describes the color-display-enabled liquid crystal display device, for example, the present invention is not limited to the color-display-ready liquid crystal display device and may be a monochrome-display-ready liquid crystal display device. Appropriate modifications made in the range not departing from the gist of the present invention also naturally belong to the technical scope of the present invention.

The display device of the present aspect can take the following aspects, for example.

(1) A display device including:
a first substrate;
a second substrate placed facing the first substrate; and
a plurality of spacers provided between the first substrate and the second substrate,
the first substrate including:
a display region in which a plurality of pixels are arrayed in a row direction and a column direction;
a plurality of gate lines extending in the row direction and connected to the pixels;
a plurality of signal lines extending in the column direction and connected to the pixels;
pixel transistors provided in the respective pixels and each having a semiconductor layer;
at least one first semiconductor resistance element overlapping with one of the spacers and provided as the same layer as the semiconductor of the pixel transistors;
at least one second semiconductor resistance element provided as the same layer as the semiconductor layer of the pixel transistors and not overlapping with any of the spacers; and
a detection circuit detecting a force applied to the display region based on a midpoint voltage between the first semiconductor resistance element and the second semiconductor resistance element, and
a resistance value of the second semiconductor resistance element is equivalent to a resistance value of the first semiconductor resistance element when no force is applied.

(2) The display device according to (1), in which the first semiconductor resistance element and the second semiconductor resistance element are placed adjacent to each other to form a sensor part.
(3) The display device according to (2), in which the sensor part is one of a plurality of sensor parts.
(4) The display device according to (2) or (3), in which the sensor part is placed in a frame region outside the display region.
(5) The display device according to any one of (1) to (4), in which the at least one first semiconductor resistance element includes two first semiconductor resistance elements and the at least one second semiconductor resistance element includes two second semiconductor resistance elements to form a Wheatstone bridge circuit.
(6) The display device according to any one of (1) to (5), in which a metallic film is provided at least between the spacer overlapping with the first semiconductor resistance element and the first semiconductor resistance element.
(7) The display device according to any one of (1) to (6), including:
pixel electrodes provided in the respective pixels;
at least one drive electrode to which a common potential to the pixel electrodes is supplied; and
an auxiliary wire electrically connected to the drive electrode, in which
the metallic film is the same layer as the auxiliary wire.
(8) The display device according to any one of (1) to (7), further including a gate electrode provided as the same layer as the gate lines and overlapping with the first semiconductor resistance element and the second semiconductor resistance element, in which
the first semiconductor resistance element, the second semiconductor resistance element, and the gate electrode form a transistor element.

What is claimed is:
1. A display device including:
a first substrate;
a second substrate placed facing the first substrate; and
a plurality of spacers provided between the first substrate and the second substrate,
the first substrate including:
a display region in which a plurality of pixels are arrayed in a row direction and a column direction;
a plurality of gate lines extending in the row direction and connected to the pixels;
a plurality of signal lines extending in the column direction and connected to the pixels;
pixel transistors provided in the respective pixels and each having a semiconductor layer;
at least one first semiconductor resistance element overlapping with one of the spacers and provided as the same layer as the semiconductor layer of the pixel transistors;
at least one second semiconductor resistance element provided as the same layer as the semiconductor layer of the pixel transistors and not overlapping with any of the spacers; and
a detection circuit detecting a force applied to the display region based on a midpoint voltage between the first semiconductor resistance element and the second semiconductor resistance element, and
a resistance value of the second semiconductor resistance element is equivalent to a resistance value of the first semiconductor resistance element when no force is applied.

2. The display device according to claim 1, in which the first semiconductor resistance element and the second semiconductor resistance element are placed adjacent to each other to form a sensor part.

3. The display device according to claim 2, in which the sensor part is one of a plurality of sensor parts.

4. The display device according to 2, in which the sensor part is placed in a frame region outside the display region.

5. The display device according to claim 4, in which the at least one first semiconductor resistance element includes two first semiconductor resistance elements and the at least one second semiconductor resistance element includes two second semiconductor resistance elements to form a Wheatstone bridge circuit.

6. The display device according to claim 4, in which a metallic film is provided at least between the spacer overlapping with the first semiconductor resistance element and the first semiconductor resistance element.

7. The display device according to claim 6, including:
pixel electrodes provided in the respective pixels;
at least one drive electrode to which a common potential to the pixel electrodes is supplied; and
an auxiliary wire electrically connected to the drive electrode, in which
the metallic film is the same layer as the auxiliary wire.

8. The display device according to claim 4, further including a gate electrode provided as the same layer as the gate lines and each overlapping with the first semiconductor resistance element and the second semiconductor resistance element, in which
the first semiconductor resistance element, the second semiconductor resistance element, and the gate electrode form a transistor element.

* * * * *